US012490619B2

(12) United States Patent
Joo et al.

(10) Patent No.: US 12,490,619 B2
(45) Date of Patent: Dec. 2, 2025

(54) DISPLAY DEVICE INCLUDING A LIGHT BLOCKING LAYER PARTIALLY EXPOSING AN OPENING IN A PIXEL DEFINING LAYER

(71) Applicant: Samsung Display Co., Ltd., Yongin-Si (KR)

(72) Inventors: Sun-Kyu Joo, Suwon-si (KR); Keunchan Oh, Hwaseong-si (KR); Jangsoo Kim, Asan-si (KR); Jae Cheol Park, Hwaseong-si (KR); Gak Seok Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 167 days.

(21) Appl. No.: 17/177,244

(22) Filed: Feb. 17, 2021

(65) Prior Publication Data

US 2021/0376021 A1    Dec. 2, 2021

(30) Foreign Application Priority Data

Jun. 1, 2020    (KR) ........................ 10-2020-0065861

(51) Int. Cl.
| | |
|---|---|
| *H10K 59/38* | (2023.01) |
| *H10K 59/122* | (2023.01) |
| *H10K 59/80* | (2023.01) |

(52) U.S. Cl.
CPC ........... *H10K 59/38* (2023.02); *H10K 59/122* (2023.02); *H10K 59/8792* (2023.02)

(58) Field of Classification Search
CPC ... H01L 27/3246; H01L 27/322; H10K 59/38; H10K 59/122; H10K 59/8792
See application file for complete search history.

(56) References Cited

U.S. PATENT DOCUMENTS

| | | | |
|---|---|---|---|
| 8,198,805 B2 | 6/2012 | Takagi et al. | |
| 9,910,265 B1* | 3/2018 | Boon | G02B 26/005 |
| 11,004,910 B2 | 5/2021 | Jung et al. | |

(Continued)

FOREIGN PATENT DOCUMENTS

| | | |
|---|---|---|
| JP | 2008-226747 A | 9/2008 |
| KR | 10-1423235 B1 | 7/2014 |

(Continued)

*Primary Examiner* — Norman D Richards
*Assistant Examiner* — Sean Ayers Winters
(74) *Attorney, Agent, or Firm* — Innovation Counsel LLP

(57) ABSTRACT

A display device includes a lower substrate, a pixel defining layer, a light emitting layer, an upper substrate, and a light blocking layer. The pixel defining layer is disposed on the lower substrate and includes a first opening and a second opening spaced apart from the first opening in a first direction. The light emitting layer is disposed in each of the first opening and the second opening. The upper substrate is disposed on the light emitting layer. The light blocking layer is disposed on the upper substrate and includes a third opening partially exposing the first opening and a fourth opening partially exposing the second opening. A first shape in which the first opening is exposed by the third opening and a second shape in which the second opening is exposed by the fourth opening are symmetrical to each other about a line of symmetry in a plan view.

18 Claims, 20 Drawing Sheets

(56) References Cited

U.S. PATENT DOCUMENTS

| | | | | |
|---|---|---|---|---|
| 2005/0253881 A1* | 11/2005 | Murayama | | H10K 71/611 |
| | | | | 347/9 |
| 2007/0216849 A1* | 9/2007 | Pan | | G02F 1/136209 |
| | | | | 349/156 |
| 2008/0001525 A1* | 1/2008 | Chao | | H10K 59/353 |
| | | | | 313/503 |
| 2011/0101857 A1* | 5/2011 | Kanatani | | G02B 5/201 |
| | | | | 445/24 |
| 2012/0098847 A1* | 4/2012 | Parmar | | G09G 3/3466 |
| | | | | 345/589 |
| 2015/0048347 A1* | 2/2015 | Tokuda | | H10K 50/865 |
| | | | | 257/40 |
| 2015/0090987 A1 | 4/2015 | Uetake | | |
| 2015/0236074 A1* | 8/2015 | Akagawa | | G02B 5/201 |
| | | | | 257/40 |
| 2016/0035795 A1* | 2/2016 | Lim | | H10K 59/38 |
| | | | | 257/40 |
| 2016/0181336 A1* | 6/2016 | Tokuda | | H10K 50/865 |
| | | | | 257/40 |
| 2017/0062515 A1* | 3/2017 | Kim | | H01L 33/58 |
| 2017/0179206 A1 | 6/2017 | Lee et al. | | |
| 2017/0250377 A1 | 8/2017 | Tokuda | | |
| 2018/0197922 A1* | 7/2018 | Song | | H10K 50/805 |
| 2018/0269267 A1* | 9/2018 | Ohchi | | G09F 9/30 |
| 2019/0025638 A1 | 1/2019 | Kim et al. | | |
| 2019/0066545 A1 | 2/2019 | Jung et al. | | |
| 2019/0341428 A1* | 11/2019 | Lee | | H10K 59/40 |
| 2019/0355793 A1 | 11/2019 | Oh et al. | | |
| 2020/0135820 A1* | 4/2020 | Ohchi | | H05B 33/12 |
| 2020/0152919 A1 | 5/2020 | Joo et al. | | |
| 2020/0258946 A1* | 8/2020 | Kim | | H10K 50/115 |

FOREIGN PATENT DOCUMENTS

| | | |
|---|---|---|
| KR | 10-2015-0114371 A | 10/2015 |
| KR | 10-2018-0013655 A | 2/2018 |
| KR | 10-2019-0010777 A | 1/2019 |
| KR | 10-2019-0023268 A | 3/2019 |
| KR | 10-2019-0131635 A | 11/2019 |
| KR | 10-2020-0047943 A | 5/2020 |
| KR | 10-2020-0054382 A | 5/2020 |

* cited by examiner

DISPLAY DEVICE INCLUDING A LIGHT BLOCKING LAYER PARTIALLY EXPOSING AN OPENING IN A PIXEL DEFINING LAYER

CROSS-REFERENCE TO RELATED APPLICATION

This application claims priority under 35 USC § 119 to Korean Patent Application No. 10-2020-0065861 filed on Jun. 1, 2020 in the Korean Intellectual Property Office (KIPO), the entire disclosure of which is incorporated herein by reference.

BACKGROUND

1. Field

Exemplary embodiments relate generally to a display device. More particularly, embodiments of the present inventive concept relate to a display device including an upper structure and a lower structure.

2. Description of the Related Art

Flat panel display devices are used as display devices for replacing a cathode ray tube display device due to the lightweight and thin thickness thereof. As representative examples of such flat panel display devices, there are a liquid crystal display device and an organic light emitting display device.

Recently, a display device including a quantum dot layer and a color filter has been developed. The display device may include a lower substrate and an upper substrate. In a process of manufacturing a display device, semiconductor elements, lower electrodes, light emitting layers, upper electrodes, and the like may be provided on a top surface of the lower substrate, and the quantum dot layer and the color filter may be provided on a bottom surface of the upper substrate. Then, after the top surface of the lower substrate is disposed to face the bottom surface of the upper substrate, the lower substrate and the upper substrate may be coupled to each other by sealant, and thus the display device may be manufactured. However, a misalignment may occur in the process of sealing the upper substrate and the lower substrate, thereby causing a defect of the display device.

SUMMARY

Some exemplary embodiments provide a display device including an upper structure and a lower structure.

According to some exemplary embodiments, a display device includes a lower substrate, a pixel defining layer, a light emitting layer, an upper substrate, and a light blocking layer. The pixel defining layer is disposed on the lower substrate and includes a first opening and a second opening spaced apart from the first opening in a first direction. The light emitting layer is disposed in each of the first opening and the second opening. The upper substrate is disposed on the light emitting layer. The light blocking layer is disposed on the upper substrate and includes a third opening partially exposing the first opening and a fourth opening partially exposing the second opening. A first shape in which the first opening is exposed by the third opening and a second shape in which the second opening is exposed by the fourth opening are symmetrical to each other about a line of symmetry in a plan view.

In exemplary embodiments, light transmitted through the third opening and light transmitted through the fourth opening may have a same color.

In exemplary embodiments, the display device may further include a first color filter disposed in each of the third opening and the fourth opening of the light blocking layer, wherein the first color filter transmits a first color of light.

In exemplary embodiments, the third opening may expose a right side of the first opening and the light blocking layer may cover a left side of the first opening, and the fourth opening may expose a left side of the second opening and the light blocking layer may cover a right side of the second opening.

In exemplary embodiments, the pixel defining layer may further include a fifth opening disposed between the first opening and the second opening and a sixth opening spaced apart from the second opening in the first direction. The light blocking layer may further include a seventh opening completely exposing the fifth opening and larger than the fifth opening, and an eighth opening completely exposing the sixth opening and larger than the sixth opening.

In exemplary embodiments, the light blocking layer may further include a seventh opening partially exposing the fifth opening and an eighth opening partially exposing the sixth opening.

In exemplary embodiments, a third shape in which the fifth opening is exposed by the seventh opening and a fourth shape in which the sixth opening is exposed by the eighth opening may be symmetrical to each other about the line of symmetry in a plan view.

In exemplary embodiments, the first shape may be identical to the third shape, and the second shape may be identical to the fourth shape.

According to some exemplary embodiments, a display device includes a lower substrate, a pixel defining layer, a light emitting layer, an upper substrate, and a light blocking layer. The pixel defining layer is disposed on the lower substrate and includes a first opening and a second opening spaced apart from the first opening in a first direction. The light emitting layer is disposed in each of the first opening and the second opening. The upper substrate is disposed on the light emitting layer. The light blocking layer is disposed on the upper substrate and includes a third opening partially exposing the first opening and a fourth opening partially exposing the second opening. A first shape in which the first opening is exposed by the third opening and a second shape in which the second opening is exposed by the fourth opening are symmetrical to each other about a line of symmetry in a plan view.

In exemplary embodiments, light transmitted through the third opening and light transmitted through the fourth opening may have a same color.

The display device may further include a first color filter disposed in each of the third opening and the fourth opening of the light blocking layer. The first color filter may transmit a first color of light.

In exemplary embodiments, the third opening may expose a top side and a left side of the first opening and the light blocking layer may cover a bottom side and a right side of the first opening, and the fourth opening may expose a top side and a right side of the second opening and the light blocking layer may cover a bottom side and a right side of the second opening.

In exemplary embodiments, the pixel defining layer may further include a fifth opening disposed between the first opening and the second opening and a sixth opening spaced apart from the second opening in the first direction. The light blocking layer may further include a seventh opening completely exposing the fifth opening and larger than the fifth opening and an eighth opening completely exposing the sixth opening and larger than the sixth opening.

In exemplary embodiments, the pixel defining layer may further include a fifth opening disposed between the first opening and the second opening and a sixth opening spaced apart from the second opening in the first direction. The light blocking layer may further include a seventh opening partially exposing the fifth opening and an eighth opening partially exposing the sixth opening.

In exemplary embodiments, a third shape in which the fifth opening is exposed by the seventh opening and a fourth shape in which the sixth opening is exposed by the eighth opening may be symmetrical to each other about a line of symmetry disposed between the seventh opening and the eighth opening in a plan view.

In exemplary embodiments, the first shape may be identical to the third shape and the second shape may be identical to the fourth shape.

According to some exemplary embodiments, a display device includes a lower substrate including a pixel defining layer that includes a plurality of first openings through which a color of light is configured to emit and an upper substrate including a light blocking layer that includes a plurality of second openings exposing the plurality of first openings, respectively. Distances between adjacent openings of the plurality of second openings may not be uniform.

In exemplary embodiments, a center of one of the plurality of the first openings and a center of one of the plurality of the second openings in one pixel may not be disposed on a same point even when the plurality of the first openings and the plurality of the second openings are correctly aligned.

In exemplary embodiments, overlapped configurations of a first opening in the plurality of first openings and a second opening in the plurality of second openings in a first pixel displaying a first color and a second pixel displaying the first color and disposed adjacent to the first pixel may be symmetrical to each other about a line of symmetry which is dispose between the first pixel and the second pixel in a plan view.

In exemplary embodiments, overlapped configurations of a first opening in the plurality of first openings and a second opening in the plurality of second openings in a first pixel displaying a first color and a second pixel displaying the first color and disposed adjacent to the first pixel may be symmetrical to each other about a point of symmetry which is dispose between the first pixel and the second pixel in a plan view.

The display device according to the exemplary embodiments of the present inventive concept may reduce a defect rate for misalignment in the horizontal direction when the upper structure is coupled to the lower structure.

In addition, the display device according to the exemplary embodiments of the present inventive concept may reduce a defect rate for misalignment in the horizontal direction and the vertical direction when the upper structure is coupled to the lower structure.

BRIEF DESCRIPTION OF THE DRAWINGS

Exemplary embodiments can be understood in more detail from the following description taken in conjunction with the accompanying drawings, in which.

DETAILED DESCRIPTION OF THE EMBODIMENTS

Figure 1:
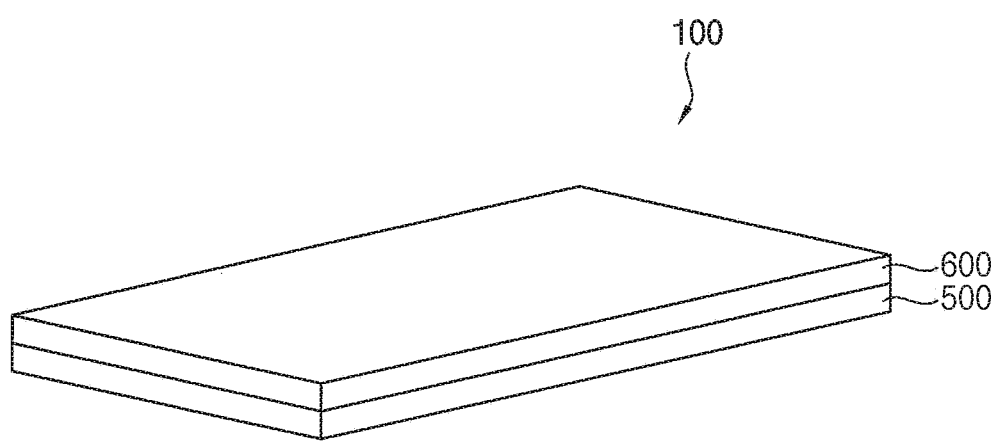
FIG. 1 is a perspective view showing a display device according to exemplary embodiments of the present inventive concept.
Figure 1:
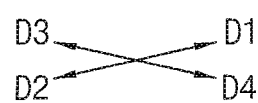

Hereinafter, display devices and a method of manufacturing a display device according to exemplary embodiments of the present inventive concept will be described in detail with reference to the accompanying drawings. In the accompanying drawings, same or similar reference numerals refer to the same or similar elements.

Figure 2:
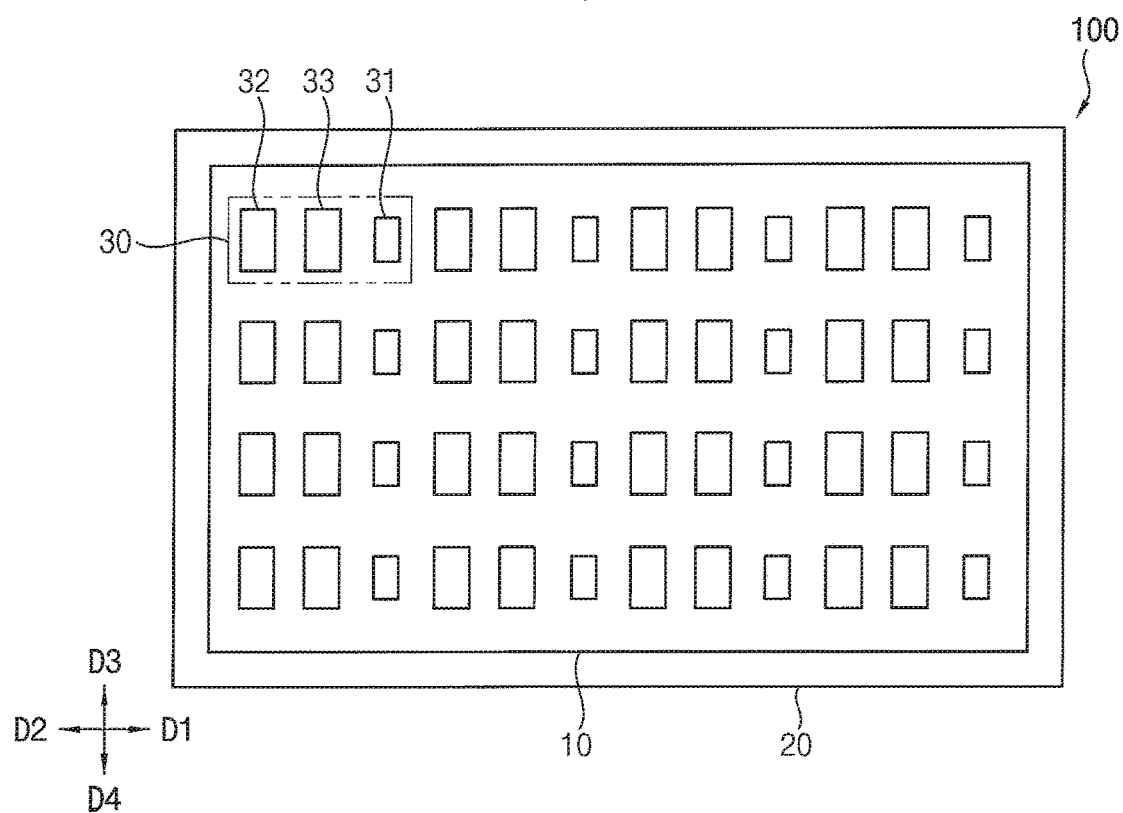
FIG. 2 is a plan view showing the display device of FIG. 1.
Figure 3:
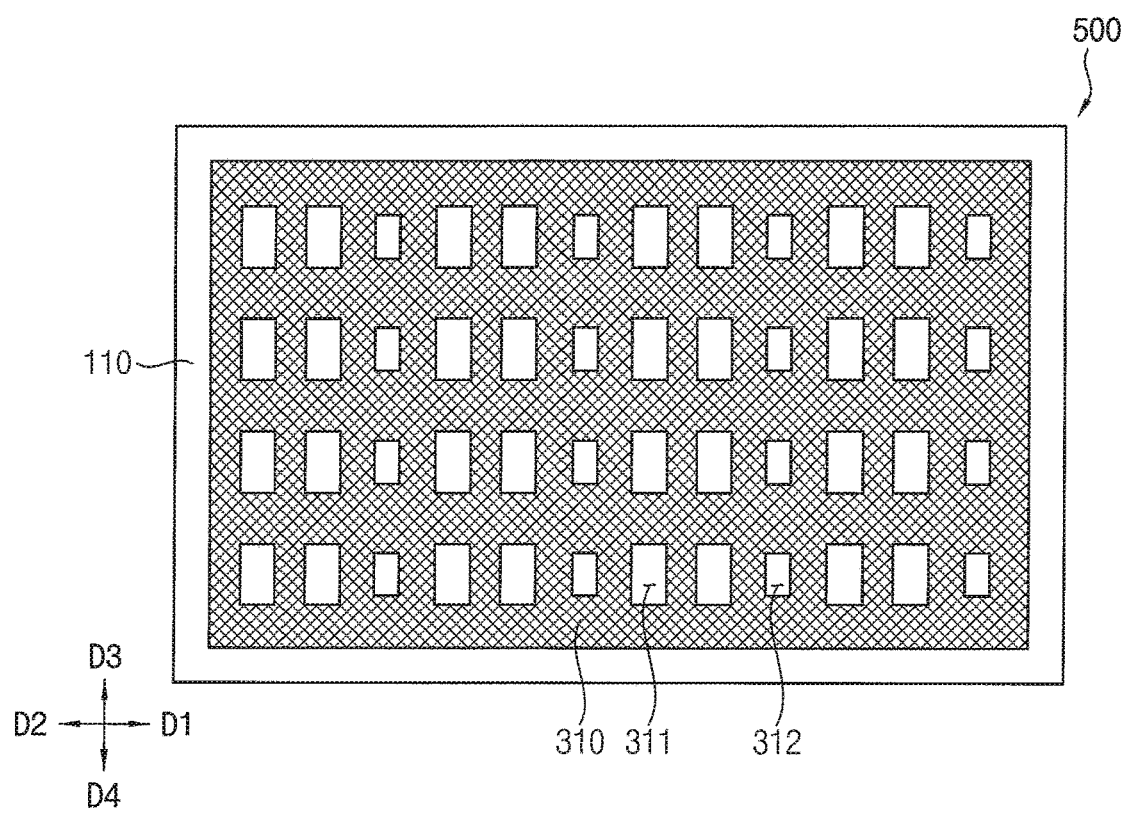
FIG. 3 is a plan view for explaining a pixel defining film included in the display device of FIG. 1.
Figure 4:
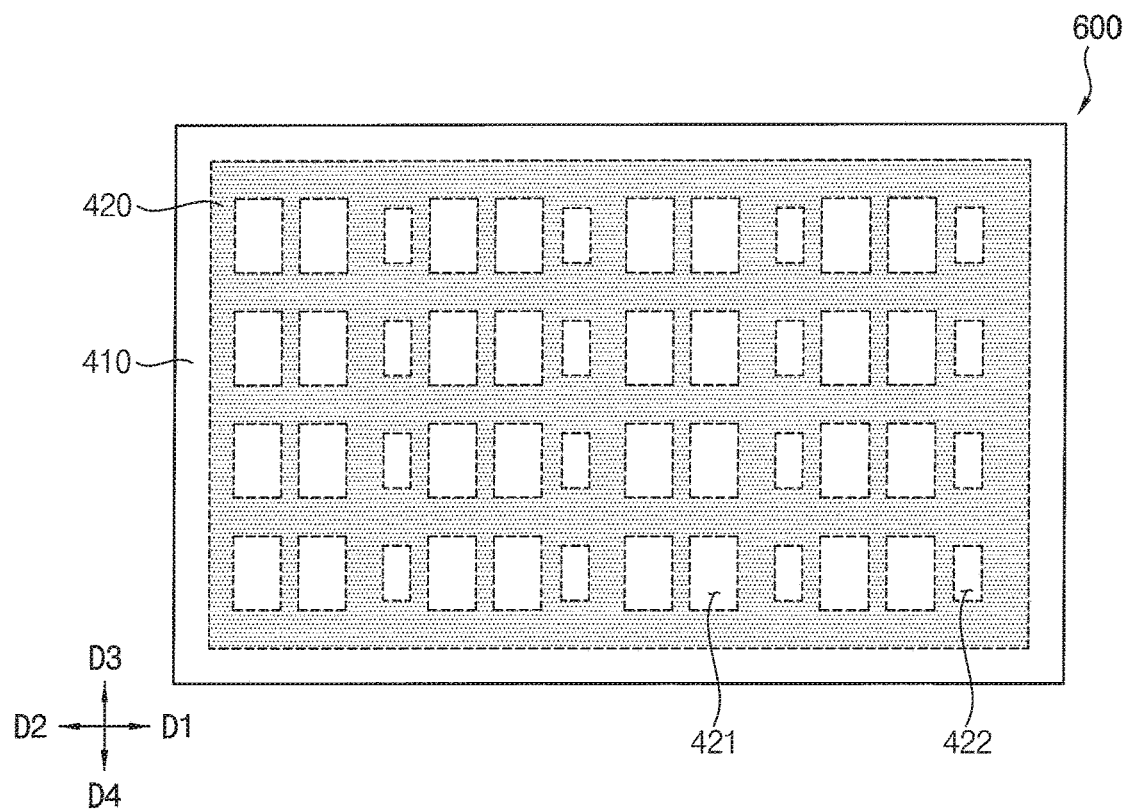
FIG. 4 is a plan view for explaining a light blocking layer included in the display device of FIG. 1.

FIG. 1 is a perspective view showing a display device according to exemplary embodiments of the present inventive concept. FIG. 2 is a plan view showing the display device of FIG. 1. FIG. 3 is a plan view for explaining a pixel defining film included in the display device of FIG. 1. FIG. 4 is a plan view for explaining a light blocking layer included in the display device of FIG. 1.

Referring to FIGS. 1, 2, 3 and 4, the display device 100 may include a lower structure 500 and an upper structure 600. The lower structure 500 and the upper structure 600 may come into direct contact with each other and may be sealed and coupled by a sealant disposed at an outermost portion of the display panel 100. For example, the lower structure 500 and the upper structure 600 may be manufactured independently and may be sealed and coupled to each other by the sealant.

As shown in FIG. 2, the display device 100 may include a display area 10 and a peripheral area 20. The display area 10 may include a plurality of pixel areas 30. The pixel areas 30 may be arranged over the whole of the display area 10 in a matrix form. Each of the pixel areas 30 may include a first sub-pixel area 31, a second sub-pixel area 32, and a third sub-pixel area 33.

In exemplary embodiments, the second sub-pixel area 32, the third sub-pixel area 33, and the first sub-pixel area 31 may be sequentially arranged in a first direction D1 parallel to a top surface of the display device 100, and a size of the first sub-pixel area 31 may be relatively smaller than each size of the second sub-pixel area 32 and the third sub-pixel area 33.

For example, pixel structures (such as semiconductor elements and light emitting structures) may be disposed in the display area 10, and the sealant, signal wirings, power wirings, and the like may be disposed in the peripheral area 20.

According to the present inventive concept, the second sub-pixel area 32, the third sub-pixel area 33, and the first sub-pixel area 31 included in each of the pixel areas 30 have been described as being arranged in the first direction D1, but the configuration of the present inventive concept is not limited thereto. For example, the first sub-pixel area 31 may be positioned while being spaced apart from the second sub-pixel area 32 in a second direction D2 opposite to the first direction D1. In contrast, the first sub-pixel area 31 may be positioned while being spaced apart from the second sub-pixel area 32 and the third sub-pixel area 33 in a third direction D3 orthogonal to the first direction D1 and the second direction D2 or in a fourth direction D4 opposite to the third direction D3.

In addition, according to the present inventive concept, the size of the second sub-pixel area 32 is shown as being the same as the size of the third sub-pixel area 33, but the configuration of the present inventive concept is not limited thereto. For example, the size of the second sub-pixel area 32 may be larger or smaller than the size of the third sub-pixel area 33. However, even when the size of the second sub-pixel area 32 is smaller than the size of the third sub-pixel area 33, the size of the second sub-pixel area 32 may be larger than the size of the first sub-pixel area 31.

In addition, although the pixel area 30 of the present inventive concept has been described as including three sub-pixel areas 31, 32 and 33, the configuration of the present inventive concept is not limited thereto. For example, the pixel area 30 may include two sub-pixel areas or at least four sub-pixel areas.

Further, although each of the display area 10, the peripheral area 20, the pixel area 30, the first sub-pixel area 31, the second sub-pixel area 32, and the third sub-pixel area 33 of the present inventive concept has been described as having a rectangular plane shape, the configuration of the present inventive concept is not limited thereto. For example, the above shape may have a triangular plane shape, a rhombic plane shape, a polygonal plane shape, a circular plane shape, a track plane shape, or an oval plane shape, when viewed from the top.

As shown in FIG. 3, the lower structure 500 may include a lower substrate 110, a pixel defining film 310, and the like. The pixel defining film 310 may be disposed on the lower substrate 110. The pixel defining film 310 may include pixel openings 311 and small pixel openings 312. For example, the pixel openings 311 may be formed to correspond to the second sub-pixel area 32 and the third sub-pixel area 33, respectively, and the small pixel openings 312 may be formed to correspond to the first sub-pixel area 31. In other words, each size of the pixel openings 311 may be substantially the same as each size of the second sub-pixel area 32 and the third sub-pixel area 33, and each size of the small pixel openings 312 may be substantially the same as the size of the first sub-pixel area 31.

As shown in FIG. 4, the upper structure 600 may include an upper substrate 410, a light blocking layer 420, and the like. The light blocking layer 420 may be disposed on a bottom surface of the upper substrate 410. In exemplary embodiments, the light blocking layer 420 may include openings 421 and small openings 422. For example, the openings 421 may be formed in areas corresponding to the pixel openings 311, respectively, and the small openings 422 may be positioned on the small pixel openings 312, respectively. In addition, each size of the openings 421 may be larger than each size of the pixel openings 311, and each size of the small openings 422 may be larger than each size of the small pixel openings 312.

For example, the light emitting layer may be disposed on the pixel openings 311 and the small pixel openings 312 of the pixel defining film 310, and light emitted from the light emitting layer may be discharged to the outside through the openings 421 and the small openings 422 of the light blocking layer 420.

Figure 5:
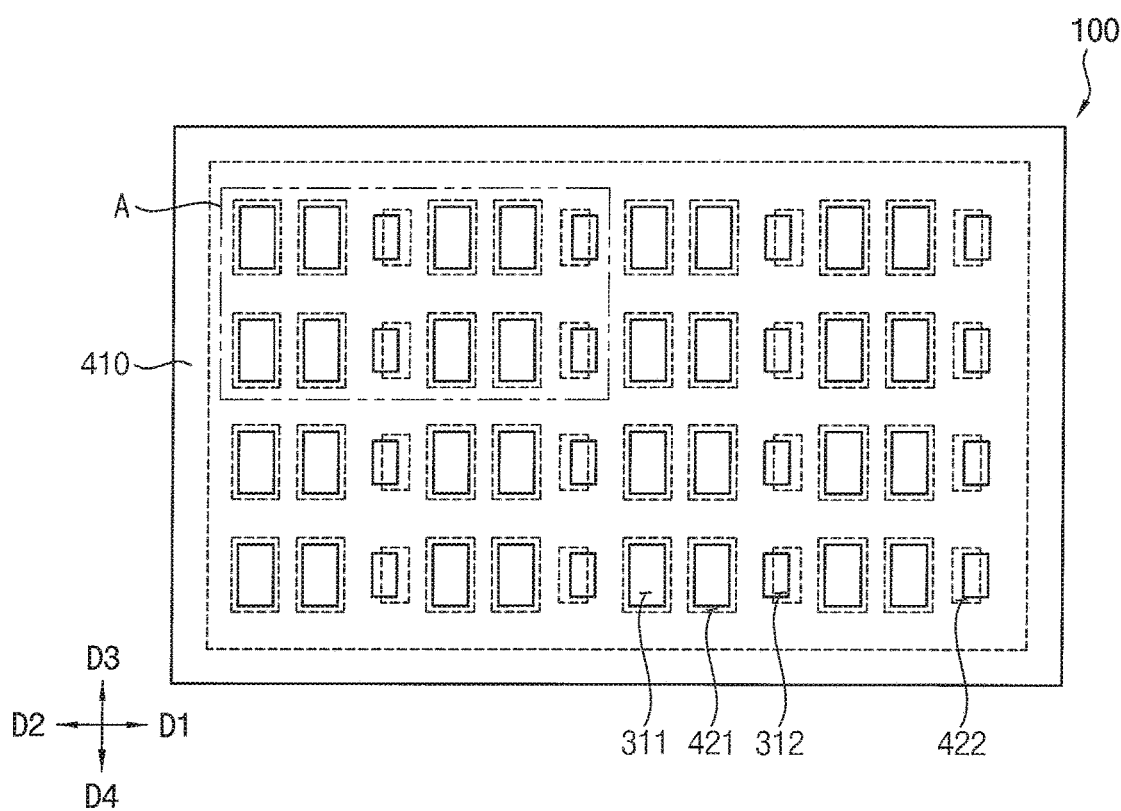
FIG. 5 is a plan view showing a shape in which openings of the pixel defining film overlap openings of the light blocking layer included in the display device of FIG. 1.
Figure 6:
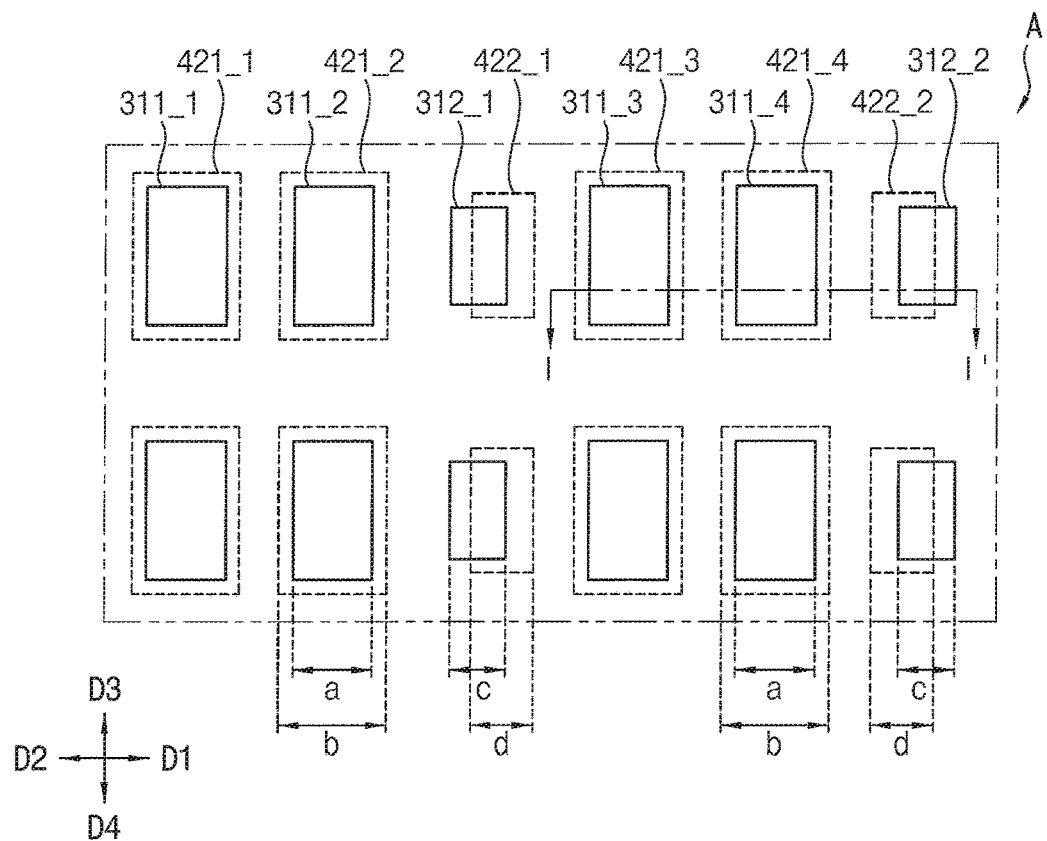
FIG. 6 is an enlarged plan view showing the area 'A' of FIG. 5.
Figure 7:
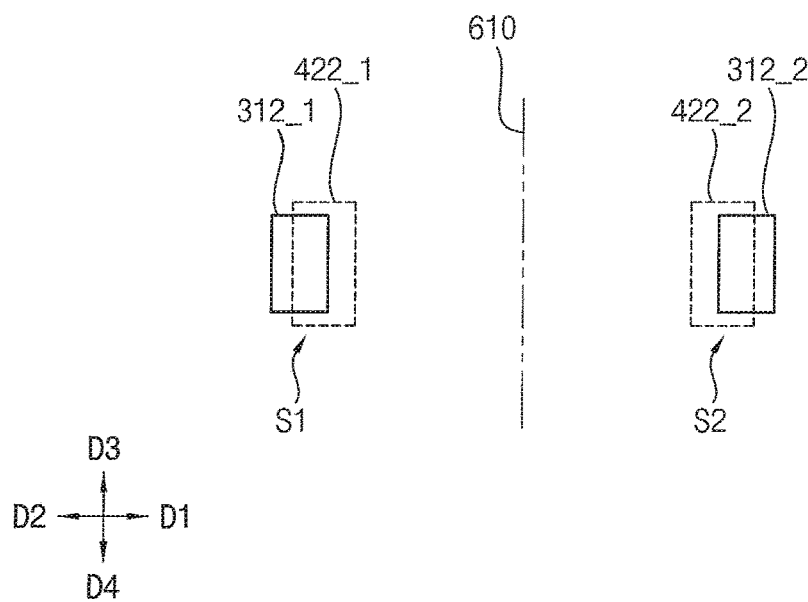
FIG. 7 is a plan view for explaining a shape in which the openings of the pixel defining film overlap the openings of the light blocking layer of FIG. 6.

FIG. 5 is a plan view showing a shape in which openings of the pixel defining film overlap openings of the light blocking layer included in the display device of FIG. 1. FIG. 6 is an enlarged plan view showing the area 'A' of FIG. 5. FIG. 7 is a plan view for explaining a shape in which the openings of the pixel defining film overlap the openings of the light blocking layer of FIG. 6.

Referring to FIGS. 5, 6 and 7, when viewed in the direction perpendicular to the top surface of the upper substrate 410, the pixel openings 311 and the openings 421 may be disposed to overlap each other. In other words, the openings 421 may completely expose the pixel openings 311, respectively. In addition, when viewed in the direction perpendicular to the top surface of the upper substrate 410, the small openings 422 may partially expose the small pixel openings 312, respectively. In other words, a portion of each of the small pixel openings 312 may be partially covered by the light blocking layer 420. In exemplary embodiments, some of the small openings 422_1 may be shifted in the first direction D1 so that a left portion of the small pixel opening 312_1 is not exposed by the small openings 422_1, and the remaining of the small openings 422_2 may be shifted in the second direction D2 so that a right portion of the small pixel opening 312_2 is not exposed by the small openings 422_2.

For example, as shown in FIG. 6, the pixel openings 311 may include a first pixel opening 311_1 (for example, a fifth opening), a second pixel opening 311_2, a third pixel opening 311_3 (for example, a sixth opening), and a fourth pixel opening 311_4, and the small pixel openings 312 may include a first small pixel opening 312_1 (for example, a first opening) and a second small pixel opening 312_2 (for example, a second opening). In addition, the openings 421 may include a first opening 421_1 (for example, a seventh opening), a second opening 421_2, a third opening 421_3 (for example, an eighth opening), and a fourth opening 421_4, and the small openings 422 may include a first small opening 422_1 (for example, a third opening) and a second small opening 422_2 (for example, a fourth opening).

The first pixel opening 311_1, the second pixel opening 311_2, and the first small pixel opening 312_1 may be disposed in the first pixel area, and the third pixel opening 311_3, the fourth pixel opening 311_4, and the second small pixel opening 312_2 may be disposed in a second pixel area adjacent to the first pixel area along a first direction D1.

In exemplary embodiments, light emitted from a light emitting layer disposed on a first small pixel opening 312_1 and light emitted from a light emitting layer disposed on the second small pixel opening 312_2 may have the same color, or a color in which the light emitted from the light emitting layer disposed on the first small pixel opening 312_1 is discharged to the outside of the display device 100 through the first small opening 422_1 may be the same as a color in which the light emitted from the light emitting layer disposed on the second small pixel opening 312_2 is discharged to the outside of the display device 100 through the second small opening 422_2.

In addition, light emitted from a light emitting layer disposed on the first pixel opening 311_1 and light emitted from a light emitting layer disposed on the third pixel opening 311_3 may have the same color, or a color in which the light emitted from the light emitting layer disposed on the first pixel opening 311_1 is discharged to the outside of the display device 100 through the first opening 421_1 may be the same as a color in which the light emitted from the light emitting layer disposed on the third pixel opening 311_3 is discharged to the outside of the display device 100 through the third opening 421_3.

Further, light emitted from a light emitting layer disposed on the second pixel opening 311_2 and light emitted from a light emitting layer disposed on the fourth pixel opening 311_4 may have the same color, or a color in which the light emitted from the light emitting layer disposed on the second pixel opening 311_2 is discharged to the outside of the display device 100 through the second opening 421_2 may be the same as a color in which the light emitted from the light emitting layer disposed on the fourth pixel opening 311_4 is discharged to the outside of the display device 100 through the fourth opening 421_4.

Each of the first pixel opening 311_1, the second pixel opening 311_2, the third pixel opening 311_3, and the fourth pixel opening 311_4 may have a first width a, and each of the first opening 421_1, the second opening 421_2, the third opening 421_3, and the fourth opening 421_4 may have a second width b. The width a may be smaller than the second width b. In addition, each of the first small pixel opening 312_1 and the second small pixel opening 312_2 may have a third width c, and each of the first small opening 422_1 and the second small opening 422_2 may have a fourth width d. The third width c may be smaller than the fourth width d.

The first opening 421_1, the second opening 421_2, the third opening 421_3, and the fourth opening 421_4 may completely expose the first pixel opening 311_1, the second pixel opening 311_2, the third pixel opening 311_3, and the fourth pixel opening 311_4, respectively. In other words, the first opening 421_1, the second opening 421_2, the third opening 421_3, and the fourth opening 421_4 may completely expose the first pixel opening 311_1, the second pixel opening 311_2, the third pixel opening 311_3, and the fourth pixel opening 311_4, respectively. In other words, sizes of the first opening 421_1, the second opening 421_2, the third opening 421_3, and the fourth opening 421_4 may be larger than sizes of the first pixel opening 311_1, the second pixel opening 311_2, the third pixel opening 311_3, and the fourth pixel opening 311_4, respectively.

In contrast, the first small opening 422_1 and the second small opening 422_2 may partially expose the first small pixel opening 312_1 and the second small pixel opening 312_2, respectively. In other words, the light blocking layer 420 may partially cover the left portion of the first small pixel opening 312_1 and the right portion of the second small pixel opening 312_2.

In exemplary embodiments, the second small pixel opening 312_2 may be spaced apart from the first small pixel opening 312_1 in the first direction D1, and the second small opening 422_2 may be spaced apart from the first small opening 422_1 in the first direction D1.

A left portion of each of the first small pixel opening 312_1 and the second small pixel opening 312_2 is defined as a first portion and a right portion thereof is defined as a second portion. The first small opening 422_1 may be shifted in the first direction D1 on the first small pixel opening 312_1 so that the light blocking layer 420 covers the first portion of the first small pixel opening 312_1, and the second small opening 422_2 may be shifted in the second direction D2 on the second small pixel opening 312_2 so that the light blocking layer 420 covers the second portion of the second small pixel opening 312_2. In other words, the first small opening 422_1 may be shifted in the first direction D1 on the first small pixel opening 312_1 so that the first small opening 422_1 may not completely expose the first small pixel opening 312_1, and the second small opening 422_2 may be shifted in the second direction D2 on the second small pixel opening 312_2 so that the second small opening 422-2 may not completely expose the second small pixel opening 312_2

Figure 8:
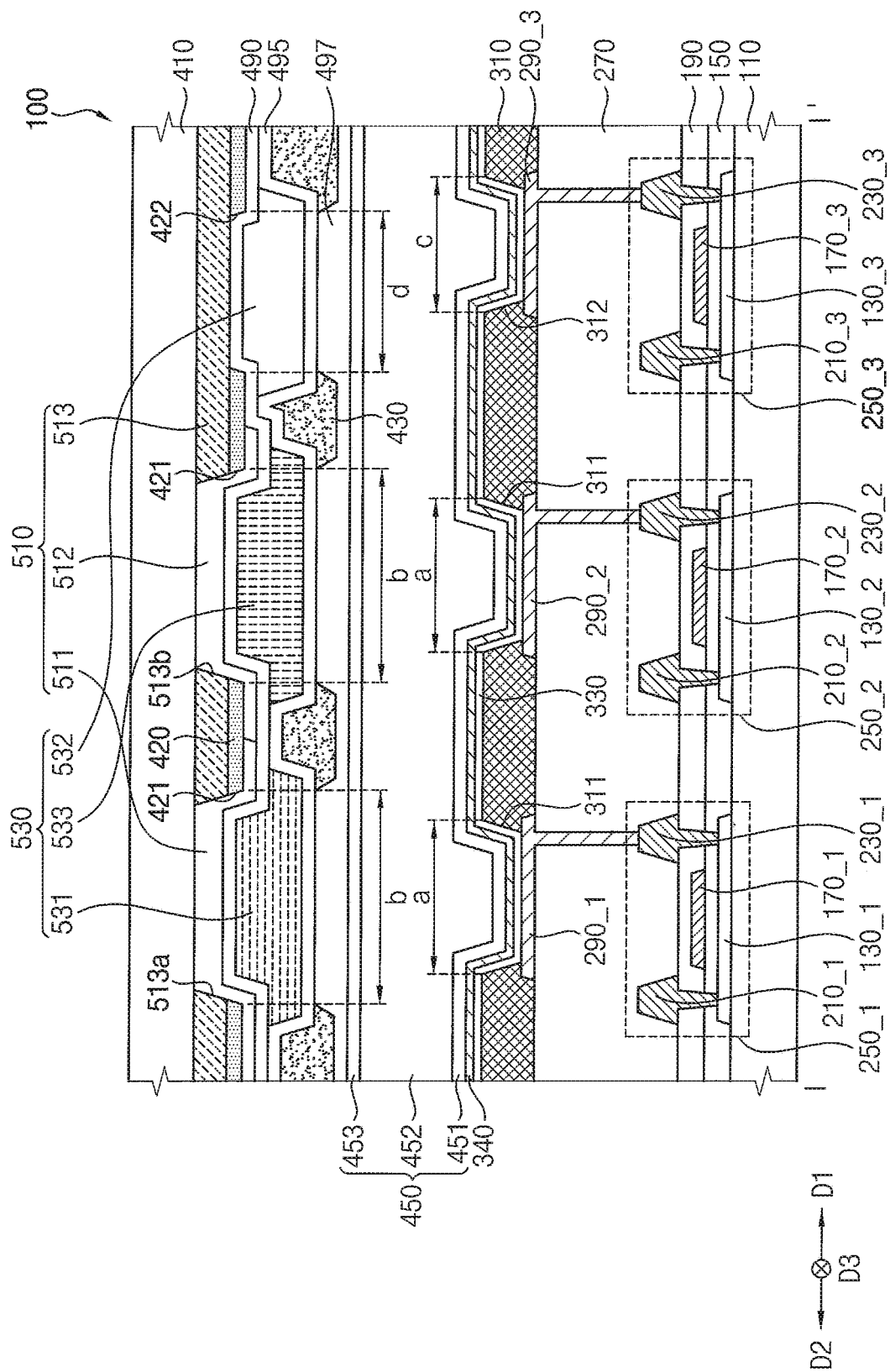
FIG. 8 is a sectional view taken along line I-I' of FIG. 6.

In exemplary embodiments, as shown in FIG. 7, when viewed in the direction perpendicular to the top surface of the upper substrate 410, a first shape S1 in which the first small pixel opening 312_1 overlaps the first small opening 422_1 and a second shape S2 in which the second small pixel opening 312_2 overlaps the second small opening 422_2 may be symmetrical to each other about a line of symmetry 610. The line of symmetry 610 may be positioned in a middle point between the first shape S1 and the second shape S2 and extend in the third direction D3 (or the fourth direction D4) perpendicular to the first direction D1 and the second direction D2. Meanwhile, as shown in FIG. 8, lower electrodes may be disposed between the pixel defining film 310 and the lower substrate 110, in which a lower electrode overlapping the first small pixel opening 312_1 is defined as a first lower electrode, and a lower electrode overlapping the second small pixel opening 312_2 is defined as a second lower electrode. The first small pixel opening 312_1 may expose a part of a top surface of the first lower electrode, and the second small pixel opening 312_2 may expose a part of a top surface of the second lower electrode. In other words, the pixel defining film 310 may cover an outer periphery of each of the first and second lower electrodes, and each of the first and second lower electrodes may have a rectangular shape when viewed from the top. Each of the first and second lower electrodes may include a first portion and a second portion facing the first portion, and the light blocking layer 420 may overlap the first portion of the first lower electrode and the second portion of the second lower electrode. For example, the first small opening 422_1 may be formed to be shifted in the first direction D1, so that a left side of the first lower electrode may overlap the light blocking layer 420, and the second small opening 422_2 may be formed to be shifted in the second direction D2, so that a right side of the second lower electrode may overlap the light blocking layer 420.

For example, in the conventional display device, the size of the first sub-pixel area (for example, the first opening of the pixel defining film) which displays blue light may be formed to be smaller than the second sub-pixel area and the third sub-pixel area which displays light other than the blue light considering a lifespan, a driving current amount, and manufacturing characteristics of the first sub-pixel area. Accordingly, the size of the second sub-pixel area (for example, the second opening of the pixel defining film which displays light other that the blue light (for example, red light or green light) may be relatively large. In the case that a misalignment occurs when the upper structure including the light blocking layer is coupled to the lower structure including the pixel defining film, a blocking portion of the light blocking layer (for example, between adjacent openings) may overlap each of the first and second sub-pixel areas. In this case, since the first sub-pixel area which displays the blue light is relatively small compared to the second sub-pixel area, the amount of change in luminance of the blue light discharged to the outside may be relatively large. However, as the resolution of the conventional display device increases, the first sub-pixel area has become smaller, thus, a failure due to a misalignment in the conventional display device increases.

In exemplary embodiments, the display device 100 may include a first small opening 422_1 and a second small opening 422_2 partially overlapping a first small pixel opening 312_1 and a second small pixel opening 312_2, respectively. In addition, when viewed in the direction perpendicular to the top surface of the upper substrate 410, a first shape S1 in which the first small pixel opening 312_1 overlaps the first small opening 422_1 and a second shape S2 in which the second small pixel opening 312_2 overlaps the second small opening 422_2 may be symmetrical to each other about a line of symmetry 610 disposed in the middle of the first shape S1 and the second shape S2. Accordingly, even when the misalignment occurs when the lower structure 500 is coupled to the upper structure 600, a total amount of light discharged to the outside through the first small opening 422_1 and the second small opening 422_2 may be maintained constant.

For example, when the upper structure 600 is shifted in the second direction D2 due to a misalignment, an overlapping area between the first small pixel opening 312_1 and the first small opening 422_1 may increase, and an overlapping area between the second small pixel opening 312_2 and the second small opening 422_2 may decrease. In contrast, when the upper structure 600 is shifted in the first direction D1 due to a misalignment, an overlapping area between the first small pixel opening 312_1 and the first small opening 422_1 may decrease, and an overlapping area between the second small pixel opening 312_2 and the second small opening 422_2 may increase. In other words, when the light emitted from the light emitting layer is discharged to the outside of the display device 100 through the first small opening 422_1 and the second small opening 422_2, the total area of light discharged to the outside may be maintained constant regardless of the misalignment. In other words, when the first small pixel opening 312_1 and the second small pixel opening 312_2 partially overlap the first small opening 422_1 and the second small opening 422_2, respectively, the total area of the light discharged to the outside may be maintained to have a predetermined level even when the misalignment occurs. Accordingly, the display device 100 according to the exemplary embodiments of the present inventive concept may reduce a defect rate due to misalignment in the horizontal direction (for example, the first direction D1 or the second direction D2) when the upper structure 600 is coupled to the lower structure 500.

FIG. 8 is a sectional view taken along line I-I' of FIG. 6.

Figure 11:
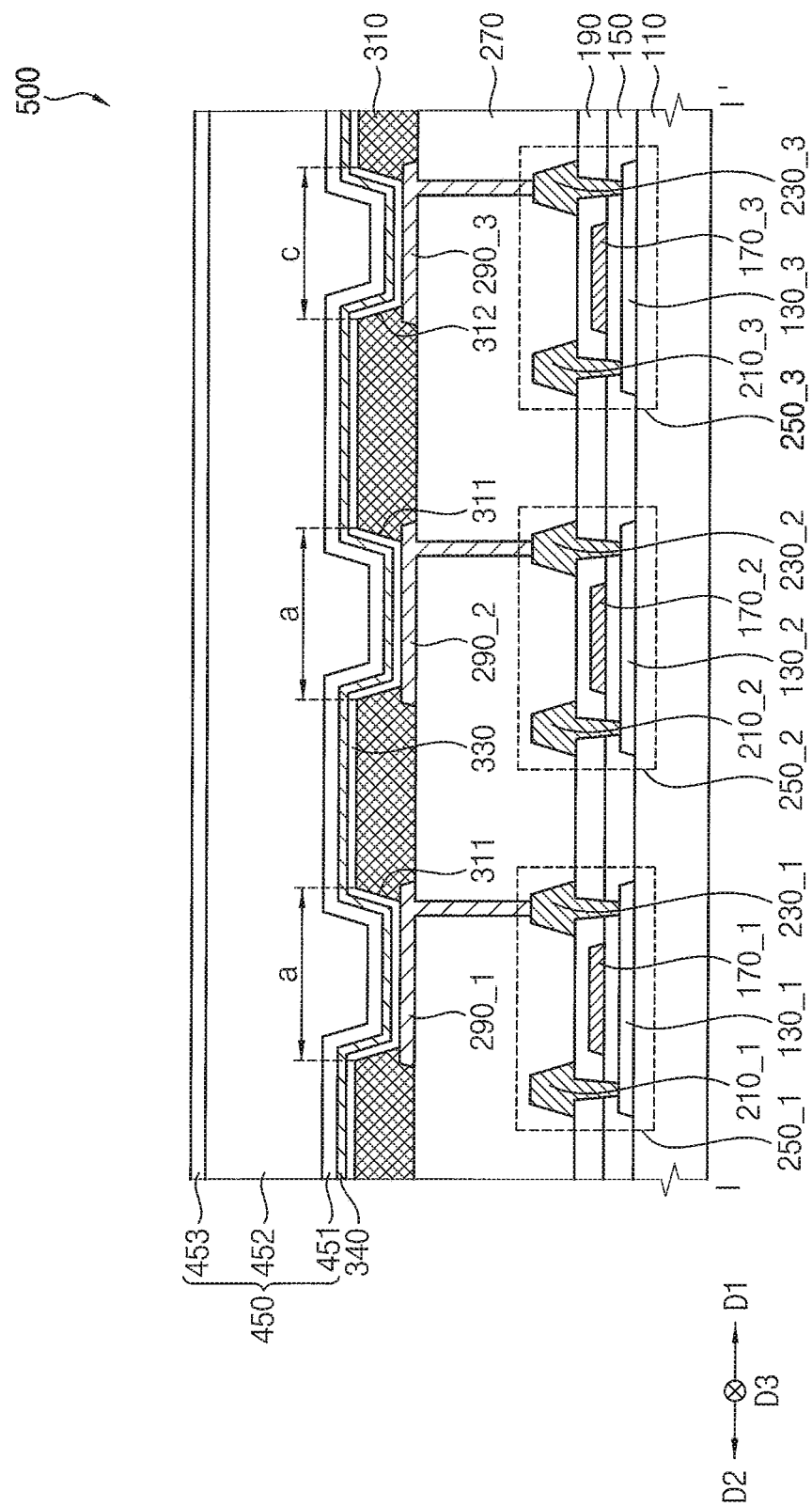
Figure 14:
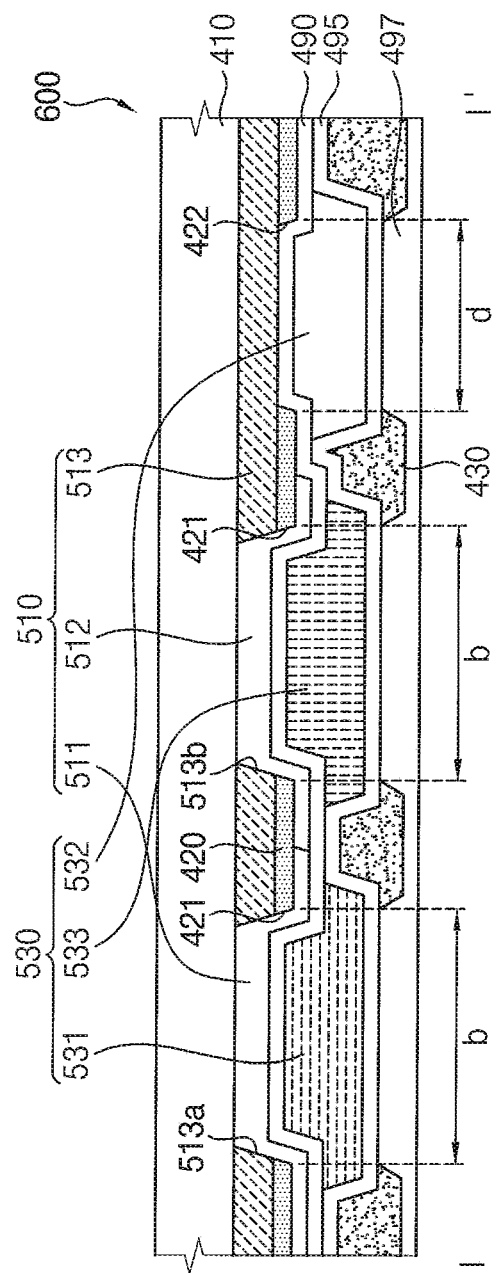

Referring to FIGS. 8, 11 and 14, the display device 100 may include a lower structure 500 and an upper structure 600.

The lower structure 500 may include a lower substrate 110, a first semiconductor element 250_1, a second semiconductor element 250_2, a third semiconductor element 250_3 a gate insulating layer 150, an interlayer insulating layer 190, a planarization layer 270, a first lower electrode 290_1, a second lower electrode 290_2, a third lower electrode 290_3, a pixel defining film 310, a light emitting layer 330, an upper electrode 340, a thin film encapsulation structure 450, and the like. The first lower electrode 290_1, the light emitting layer 330, and the upper electrode 340 are defined as a first sub-pixel structure, the second lower electrode 290_2, the light emitting layer 330, and the upper electrode 340 are defined as a second sub-pixel structure, and the third lower electrode 290_3, the light emitting layer 330, and the upper electrode 340 are defined as a third sub-pixel structure. The first semiconductor element 250_1 may include a first active layer 130_1, a first gate electrode 170_1, a first source electrode 210_1 and a first drain electrode 230_1, the second semiconductor element 250_2 may include a second active layer 130_2, a second gate electrode 170_2, a second source electrode 210_2, and a second drain electrode 230_2, and the third semiconductor element 2503 may include a third active layer 130_3, a third gate electrode 170_3, a third source electrode 2103, and a third drain electrode 230_3. In addition, the thin film encapsulation structure 450 may include a first inorganic thin film encapsulation layer 451, an organic thin film encapsulation layer 452, and a second inorganic thin film encapsulation layer 453. In exemplary embodiments, the pixel defining film 310 may include pixel openings 311 and small pixel openings 312.

The upper structure 600 may include a first protective insulating layer 490, a second protective insulating layer 495, a plurality of optical filters 530, an intermediate layer 497, a plurality of color filters 510, a light blocking layer 420, a light blocking film 430, an upper substrate 410, and the like. The optical filters 530 may include a first quantum dot pattern 531 (for example, a second optical filter), a scattering pattern 532 (for example, a first optical filter), and a second quantum dot pattern 533. Further, the color filters 510 may include a first color filter 513, a second color filter 511, and a third color filter 512. In exemplary embodiments, the light blocking layer 420 may include openings 421 and small openings 422.

The first sub-pixel structure may be disposed in the second sub-pixel area 32 shown in FIG. 2, the second sub-pixel structure may be disposed in the third sub-pixel area 33, and the third sub-pixel structure may be disposed in the first sub-pixel area 31. The display device 100 may display an image through the first to third sub-pixel structures.

Referring back to FIG. 8, the lower substrate 110 may include a transparent or opaque material. The lower substrate 110 may include a quartz substrate, a synthetic quartz substrate, a calcium fluoride substrate, a fluorine-doped (F-doped) quartz substrate, a soda-lime glass substrate, a non-alkali glass substrate, and the like.

In other exemplary embodiments, the lower substrate 110 may be formed of a transparent resin substrate having flexibility. An example of the transparent resin substrate that can be used for the lower substrate 110 may include a polyimide substrate. In this case, the polyimide substrate may have a laminated structure including a first polyimide layer, a barrier film layer, and a second polyimide layer.

A buffer layer (not shown) may be disposed on the lower substrate 110. The buffer layer may be disposed over a whole of the lower substrate 110. The buffer layer may prevent metal atoms or impurities from diffusing from the lower substrate 110 into the semiconductor element and the sub-pixel structure and may adjust the rate of heat transfer during a crystallization process for forming the active layer so as to obtain a substantially uniform active layer. In addition, when a surface of the lower substrate 110 is not uniform, the buffer layer may serve to improve the flatness of the surface of the lower substrate 110. Depending on a type of substrate 110, at least two buffer layers may be provided on the substrate 110, or the buffer layer may not be disposed thereon. For example, the buffer layer may include an organic material or an inorganic material.

The first to third active layers 130_1, 130_2, and 1303 may be disposed on the lower substrate 110 while being spaced apart from each other. Each of the first to third active layers 130_1, 130_2, and 130_3 may include a metal oxide semiconductor, an inorganic semiconductor (such as amorphous silicon and poly silicon), an organic semiconductor, and the like, and may include a source area and a drain area.

The gate insulating layer 150 may be disposed on the first to third active layers 130_1, 130_2, and 130_3. The gate insulating layer 150 may cover the first to third active layers 130_1, 130_2, and 130_3 on the lower substrate 110, and may be disposed over a whole of the lower substrate 110. For example, the gate insulating layer 150 may sufficiently cover the first to third active layers 130_1, 130_2, and 130_3 on the lower substrate 110, and may have a substantially planarized top surface without generating a step around the first to third active layers 130_1, 130_2, and 130_3. Alternatively, the gate insulating layer 150 may cover the first to third active layers 130_1, 130_2, and 130_3 on the lower substrate 110, and may be disposed to have a uniform thickness along profiles of the first to third active layers 130_1, 130_2, and 130_3. The gate insulating layer 150 may include a silicon compounds, metal oxides, and the like. For example, the gate insulating layer 150 may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and the like. In other exemplary embodiments, the gate insulating layer 150 may have a multi-layer structure including a plurality of insulating layers. For example, the insulating layers may have different thicknesses or include different materials.

The first to third gate electrodes 170_1, 170_2, and 1703 may be disposed on the gate insulating layer 150 while being spaced apart from each other. For example, the first gate electrode 170_1 may be disposed on a portion of the gate insulating layer 150 under which the first active layer 1301 is disposed, the second gate electrode 170_2 may be disposed on a portion of the gate insulating layer 150 under which the second active layer 130_2 is disposed, and the third gate electrode 170_3 may be disposed on a portion of the gate insulating layer 150 under which the third active layer 130_3 is disposed. Each of the first to third gate electrodes 170_1, 170_2, and 170_3 may include a metal, an alloy, a metal nitride, a conductive metal oxide, a transparent conductive material, and the like. For example, each of the first to third gate electrodes 170_1, 170_2, and 170_3 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, aluminum nitride (AlN), an alloy containing silver, tungsten nitride (WN), an alloy containing copper, an alloy containing molybdenum, titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), and the like. These may be used individually or in combination. In other exemplary embodiments, each of the first to third gate electrodes 170_1, 170_2, and 170_3 may have a multi-layer structure including a plurality of metal layers. For example, the metal layers may have different thicknesses or include different materials.

The interlayer insulating layer 190 may be disposed on the first to third gate electrodes 170_1, 170_2, and 170_3. The interlayer insulating layer 190 may cover the first to third gate electrodes 170_1, 170_2, and 170_3 on the gate insulating layer 150 and may be disposed over a whole of the gate insulating layer 150. For example, the interlayer insulating layer 190 may sufficiently cover the first to third gate electrodes 170_1, 170_2, and 170_3 on the gate insulating layer 150 and may have a substantially planarized top surface without generating a step around the first to third gate electrodes 170_1, 170_2, and 170_3. Alternatively, the interlayer insulating layer 190 may cover the first to third gate electrodes 170_1, 170_2, and 170_3 on the gate insulating layer 150 and may be disposed to have a uniform thickness along profiles of the first to third gate electrodes 170_1, 170_2, and 170_3. The interlayer insulating layer 190 may include a silicon compounds, metal oxides, and the like. In other exemplary embodiments, the interlayer insulating layer 190 may have a multi-layer structure including a plurality of insulating layers. For example, the insulating layers may have different thicknesses or include different materials.

A first source electrode 210_1, a first drain electrode 230_1, a second source electrode 210_2, a second drain electrode 230_2, a third source electrode 2103, and a third drain electrode 230_3 may be disposed on the interlayer insulating layer 190 while being spaced apart from each other. For example, the first source electrode 210_1 may be connected to the source area of the first active layer 130_1 through a contact hole formed by removing first portions of the gate insulating layer 150 and the interlayer insulating layer 190, and the first drain electrode 230_1 may be connected to the drain area of the first active layer 130_1 through a contact hole formed by removing second portions of the gate insulating layer 150 and the interlayer insulating layer 190. In addition, the second source electrode 210_2 may be connected to the source area of the second active layer 130_2 through a contact hole formed by removing third portions of the gate insulating layer 150 and the interlayer insulating layer 190, and the second drain electrode 230_2 may be connected to the drain area of the second active layer 130_2 through a contact hole formed by removing fourth portions of the gate insulating layer 150 and the interlayer insulating layer 190. Further, the third source electrode 210_3 may be connected to the source area of the third active layer 130_3 through a contact hole formed by removing fifth portions of the gate insulating layer 150 and the interlayer insulating layer 190, and the third drain electrode 230_3 may be connected to the drain area of the third active layer 130_3 through a contact hole formed by removing sixth portions of the gate insulating layer 150 and the interlayer insulating layer 190. The first to third source electrodes 210_1, 210_2, and 210_3 and the first to third drain electrodes 230_1, 230_2, and 230_3 may include a metal, an alloy, a metal nitride, a conductive metal oxide, a transparent conductive material, and the like. These may be used individually or in combination. In other exemplary embodiments, the first to third source electrodes 210_1, 210_2, and 210_3 and the first to third drain electrodes 230_1, 230_2, and 230_3 may have a multi-layer structure including a plurality of metal layers. For example, the metal layers may have different thicknesses or include different materials.

Accordingly, the first semiconductor element 250_1 including the first active layer 130_1, the first gate electrode 170_1, the first source electrode 210_1 and the first drain electrode 230_1 may be disposed on the lower substrate 110, the second semiconductor element 250_2 including the second active layer 1302, the second gate electrode 170_2, the second source electrode 210_2 and the second drain electrode 230_2 may be disposed on the lower substrate 110, and the third semiconductor element 250_3 including the third active layer 130_3, the third gate electrode 170_3, the third source electrode 210_3 and the third drain electrode 230_3 may be disposed one the lower substrate 110.

Although the display device 100 has been described as having three transistors (such as first to third semiconductor elements 250-1, 250_2, and 250_3), the configuration of the present inventive concept is not limited thereto. For example, the display device 100 may be configured to include a plurality of transistors and a plurality of capacitors.

In addition, although each of the first to third semiconductor elements 250_1, 250_2, and 250_3 has been described as having a top gate structure, the configuration of the present inventive concept is not limited thereto. For example, each of the first to third semiconductor elements 250_1, 250_2, and 250_3 may have a bottom gate structure and/or dual gate structure.

The planarization layer 270 may be disposed on the interlayer insulating layer 190 and the first to third semiconductor elements 250_1, 250_2 and 250_3. For example, the planarization layer 270 may be relatively thickly arranged to sufficiently cover the first to third source electrodes 210_1, 210_2, and 210_3 and the first to third drain electrodes 230_1, 230_2, and 230_3 on the interlayer insulating layer 190. In this case, the planarization layer 270 may have a substantially planar top surface, and a planarization process may be added to the planarization layer 270 to implement the above planar top surface of the planarization layer 270. The planarization layer 270 may include an organic material, an inorganic material or the like. In exemplary embodiments, the planarization layer 270 may include an organic material.

The first to third lower electrodes 290_1, 290_2, and 290_3 may be disposed on the planarization layer 270 while being spaced apart from each other. For example, the first lower electrode 290_1 may be disposed in a first portion of the planarization layer 270, the second lower electrode 290_2 may be disposed in a second portion of the planarization layer 270, and the third lower electrode 290_3 may be disposed in a third portion of the planarization layer 270. The third portion of the planarization layer 270 may be spaced apart from the first portion, and the second portion of the planarization layer 270 may be positioned between the first portion and the third portion. In other words, the first portion and the second portion may overlap the pixel openings 311, respectively, and the third portion may overlap the small pixel opening 312.

The first to third lower electrodes 290_1, 290_2, and 290_3 may be connected to the first to third drain electrodes 230_1, 230_2, and 230_3, respectively, through the planarization layer 270. In other words, the first to third lower electrodes 290_1, 290_2, and 290_3 may be electrically connected to the first to third semiconductor elements 250_1, 250_2, and 250_3, respectively. Each of the first to third lower electrodes 290_1, 290_2, and 290_3 may include a metal, an alloy, a metal nitride, a conductive metal oxide, a transparent conductive material, and the like. These may be used individually or in combination. Alternatively, the first to third lower electrodes 290_1, 290_2, and 290_3 may have a multi-layer structure including a plurality of metal layers. For example, the metal layers may have different thicknesses or include different materials.

The pixel defining film 310 may be disposed on each part of the first to third lower electrodes 290_1, 290_2, and 290_3 and on the planarization layer 270. The pixel defining film 310 may cover edges (for example, an outer periphery) of the first to third lower electrodes 290_1, 290_2, and 290_3, and may expose a part of each top surface of the first to third lower electrodes 290_1, 290_2, and 290_3. In other words, the pixel defining film 310 may include pixel openings 311 exposing a part of each top surface of the first and second lower electrodes 290_1 and 290_2 and a small pixel opening 312 exposing a part of a top surface of the third lower electrode 290_3. In exemplary embodiments, each of the pixel openings 311 may have a first width a, and the small pixel opening 312 may have a third width c. The first width a may be larger than the third width c. The pixel defining film 310 may be formed of an organic material or an inorganic material. In exemplary embodiments, the pixel defining film 310 may include an organic material. For example, the pixel defining film 310 may include photoresist, polyacryl-based resin, polyimide-based resin, polyamide-based resin, siloxane-based resin, acryl-based resin, epoxy-based resin, and the like.

The light emitting layer 330 may be disposed on the pixel defining film 310 and each top surface of the first to third lower electrodes 290_1, 290_2, and 290_3 exposed by the pixel defining film 310. In other words, the light emitting layer 330 may be disposed continuously on the lower substrate 110 and may be integrally formed with each other. In exemplary embodiments, the light emitting layer 330 may be formed using a light emitting material capable of emitting blue light. For example, since the light emitting layer 330 emits blue light, a light loss rate of the blue light which is discharged to the outside through the first color filter 513 after passing through the scattering pattern 532 may be relatively small. Accordingly, the small pixel opening 312 may have a relatively small size.

In contrast, the light emitting layer 330 may be formed by laminating a plurality of light emitting materials capable of generating different color light such as red light, green light and blue light, such that white light may be entirely emitted.

The upper electrode 340 may be disposed on the pixel defining film 310 and the light emitting layer 330. The upper electrode 340 may include a metal, an alloy, a metal nitride, a conductive metal oxide, a transparent conductive material, and the like. These may be used individually or in combination. In other exemplary embodiments, the upper electrode 340 may have a multi-layer structure including a plurality of metal layers. For example, the metal layers may have different thicknesses or include different materials.

Accordingly, the first sub-pixel structure including the first lower electrode 290_1, the light emitting layer 330, and the upper electrode 340 may be disposed on the lower substrate 110, the second sub-pixel structure including the second lower electrode 290_2, the light emitting layer 330, and the upper electrode 340 may be disposed on the lower substrate 110, and the third sub-pixel structure including the third lower electrode 290_3, the light emitting layer 330, and the upper electrode 340 may be disposed on the lower substrate 110.

The first inorganic thin film encapsulation layer 451 may be disposed on the upper electrode 340. The first inorganic thin film encapsulation layer 451 may be disposed to have a uniform thickness along a profile of the upper electrode 340 while covering the upper electrode 340. The first inorganic thin film encapsulation layer 451 may prevent the first to third sub-pixel structures from deteriorating due to the permeation of the moisture, oxygen, or the like. In addition, the first inorganic thin film encapsulation layer 451 may also function to protect the first to third sub-pixel structures from an external impact. The first inorganic thin film encapsulation layer 451 may include flexible inorganic materials.

The organic thin film encapsulation layer 452 may be disposed on the first inorganic thin film encapsulation layer 451. The organic thin film encapsulation layer 452 may improve the flatness of the display device 100 and may protect the first to third sub-pixel structures. The organic thin film encapsulation layer 452 may include flexible organic materials.

The second inorganic thin film encapsulation layer 453 may be disposed on the organic thin film encapsulation layer 452. The second inorganic thin film encapsulation layer 453 may be disposed to have a uniform thickness along the profile of the organic thin film encapsulation layer 452 while covering the organic thin film encapsulation layer 452. The second inorganic thin film encapsulation layer 453 may prevent the first to third sub-pixel structures from deteriorating due to the permeation of the moisture, oxygen, or the like, together with the first inorganic thin film encapsulation layer 451. In addition, the second inorganic thin film encapsulation layer 453 may also function to protect the first to third sub-pixel structures from the external impact, together with the first inorganic thin film encapsulation layer 451 and the organic thin film encapsulation layer 452. The second inorganic thin film encapsulation layer 453 may include the flexible inorganic materials.

Accordingly, the thin film encapsulation structure 450 including the first inorganic thin film encapsulation layer 451, the organic thin film encapsulation layer 452, and the second inorganic thin film encapsulation layer 453 may be disposed between the light blocking film 430 and the upper electrode 340. Alternatively, the thin film encapsulation structure 450 may be configured to have a five-layer structure laminated with first to fifth thin film encapsulation layers or a seven-layer structure laminated with first to seventh thin film encapsulation layers.

Accordingly, a lower structure 500, which includes the lower substrate 110, the first semiconductor element 250_1, the second semiconductor element 250_2, the third semiconductor element 2503, the gate insulating layer 150, the interlayer insulating layer 190, the planarization layer 270, the first lower electrode 290_1, the second lower electrode 290_2, the third lower electrode 290_3, the pixel defining film 310, the light emitting layer 330, the upper electrode 340, and the thin film encapsulation structure 450, may be provided.

The upper substrate 410 may be disposed on the thin film encapsulation structure 450. The upper substrate 410 may be disposed to face (or oppose) the lower substrate 110. The upper substrate 410 and the lower substrate 110 may include substantially the same material. For example, the upper substrate 410 may include a quartz substrate, a synthetic quartz substrate, a calcium fluoride substrate, a fluorine-doped quartz substrate, a soda-lime glass substrate, a non-alkali glass substrate, and the like.

A first color filter 513 may be disposed on the bottom surface of the upper substrate 410. The first color filter 513 may have openings 513a and 513b. In exemplary embodiments, the first color filter 513 may transmit blue light, and may be a color filter having a blue color (for example, a first color).

The light blocking layer may be disposed on a bottom surface of the first color filter 512. In other words, the light blocking layer 420 may be disposed on the bottom surface of the upper substrate 410 and may be disposed between the first color filter 513 and the light blocking film 430. The light blocking layer 420 may include openings 421 and small openings 422. For example, the light blocking layer 420 may have a plate shape including the openings 421 and the small openings 422. In addition, the openings 513a and 513b of the first color filter 513 may be formed to correspond to the openings 421 of the light blocking layer 420, and the small opening 422 may expose a part of the bottom surface of the first color filter 513. In other words, the portion exposed by the small opening 422 in the first color filter 513 may function as a color filter. In exemplary embodiments, each of the openings 421 of the light blocking layer 420 may have a second width b, and the small opening 422 of the light blocking layer 420 may have a fourth width d. The second width b may be larger than the fourth width d, the second width b may be larger than the first width a, and the fourth width d may be larger than the third width c. As shown in FIG. 8, the openings 421 may completely expose the pixel openings 311, respectively. In addition, the small opening 422 may partially expose the small pixel opening 312, and the light blocking layer 420 may cover a right side of the third lower electrode 290_3. In contrast, a small opening 422 positioned in an adjacent pixel area (for example, the first pixel area) may partially expose the small pixel openings 312, and the light blocking layer 420 may cover a left side of the third lower electrode 290_3. In other words, FIG. 8 shows the second pixel area of FIG. 6, and the first pixel area may show a shape symmetrical to a shape in which the small opening 422 of the light blocking layer 420 partially exposes the small pixel opening 312 of the pixel defining film 310 shown in FIG. 8.

The light blocking layer 420 may block or absorb light incident from the outside. The light blocking layer 420 may include an organic material such as photoresist, polyacryl-based resin, polyimide-based resin, polyamide-based resin, siloxane-based resin, acryl-based resin, and epoxy-based resin. In addition, the light blocking layer 420 may be substantially opaque. For example, the light blocking layer 420 may further include a light blocking material to absorb light. The light blocking material may include carbon black, titanium nitride oxide, titanium black, phenylene black, aniline black, cyanine black, nigrosine acid black, black resin, and the like.

A second color filter 511 may be disposed in the opening 513a of the first color filter 513 on the bottom surface of the upper substrate 410 and the opening 421 of the light blocking layer 420 exposing the opening 513a. A part of the second color filter 511 may also be disposed on a part of a bottom surface of the light blocking layer 420. In exemplary embodiments, the second color filter 511 may transmit red light, and may be a color filter having a red color (for example, a second color).

A third color filter 512 may be disposed in the opening 513b of the first color filter 513 on the bottom surface of the upper substrate 410 and the opening 421 of the light blocking layer 420 overlapping the opening 513b. A part of the third color filter 512 may also be disposed on a part of the bottom surface of the light blocking layer 420 and may come into contact with or overlap with the second color filter 511 on the bottom surface of the light blocking layer 420. In exemplary embodiments, the third color filter 512 may transmit green light, and may be a color filter having a green color.

Accordingly, the color filters 510 including the first color filter 513, the second color filter 511, and the third color filter 512 may be disposed. The color filters 510 may include photosensitive resin, or color photoresist.

Although the color filters 510 of the present inventive concept have been described as including a green color filter, a blue color filter, and a red color filter, the configuration of the present inventive concept is not limited thereto. For example, the color filters 510 may include a yellow color filter pattern, a cyan color filter pattern, and a magenta color filter pattern.

In addition, although the red color filter, the green color filter, and the blue color filter of the present inventive concept have been described as being sequentially arranged, the configuration of the present inventive concept is not limited thereto. For example, the arrangement of the color filters may be altered as needed.

Further, although the second and third color filters 511 and 512 have been described as being disposed in the openings 513a and 513b of the first color filter 513 of the present inventive concept, the configuration of the present inventive concept is not limited thereto. For example, the first color filter 513 may be disposed in the small opening 422 of the light blocking layer 420, and the second and third color filters 511 and 512 may be disposed in the openings 421 of the light blocking layer 420, respectively.

A first protective insulating layer 490 may be disposed under the color filters 510 and the light blocking layer 420. The first protective insulating layer 490 may cover the color filters 510 and the light blocking layer 420 on the bottom surface of the upper substrate 410. For example, the first protective insulating layer 490 may cover the color filters 510 and the light blocking layer 420 on the bottom surface of the upper substrate 410 and may be disposed to have a uniform thickness along profiles of the color filters 510 and the light blocking layer 420. Alternatively, the first protective insulating layer 490 may sufficiently cover the color filters 510 and the light blocking layer 420 on the bottom surface of the upper substrate 410 and may have a substantially planar top surface without generating a step around the color filters 510 and the light blocking layer 420. The first protective insulating layer 490 may include an inorganic material or an organic material. In other exemplary embodiments, the first protective insulating layer 490 may have a multi-layer structure including a plurality of insulating layers. For example, the insulating layers may have different thicknesses or include different materials.

Optical filters 530 may be disposed on a bottom surface of the first protective insulating layer 490 while overlapping the color filters 510. The optical filters 530 may include a first quantum dot pattern 531 for converting blue light into red light, a second quantum dot pattern 533 for converting blue light into green light and a scattering pattern 532 for transmitting blue light.

The first quantum dot pattern 531 may be disposed under the second color filter 511 while overlapping the second color filter 511, the second quantum dot pattern 533 may be disposed under the third filter 512 while overlapping the third color filter 512, and the scattering pattern 532 may be disposed under the first filter 513 while overlapping the first color filter 513. In other words, the first quantum dot pattern 531 may be disposed on the first sub-pixel structure, the second quantum dot pattern 533 may be disposed on the second sub-pixel structure, and the scattering pattern 532 may be disposed on the third sub-pixel structure. In exemplary embodiments, the first quantum dot pattern 531, the second quantum dot pattern 533, and the scattering pattern 532 may be spaced apart from each other and may be disposed on the same layer. The first quantum dot pattern 531 may include a plurality of quantum dots that absorb blue light and emit red light. The second quantum dot pattern 533 may include a plurality of quantum dots that absorb blue light and emit green light. The scattering pattern 532 may include a scattering material that emits blue light without changing a color of light.

For example, the quantum dots included in the first quantum dot pattern 531 and the second quantum dot pattern 533 may include any one among silicon-based nanocrystal, II-VI group-based compound semiconductor nanocrystal, III-V group-based compound semiconductor nanocrystal, IV-VI group-based compound semiconductor nanocrystal, and a mixture thereof. The II-VI group-based compound semiconductor nanocrystal may include one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. The III-V group-based compound semiconductor nanocrystal may include one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The IV-VI group-based compound semiconductor nanocrystal may be SbTe.

Even when the quantum dots included in the first and second quantum dot patterns 531 and 533 include the same material, a spectrum wavelength may vary according to a size of the quantum dot. For example, when the size of the quantum dot is smaller, light having a shorter wavelength may be emitted. Accordingly, the sizes of the quantum dots included in the first and second quantum dot patterns 531 and 533 are adjusted, so that light having a desired visible light zone may be emitted.

In exemplary embodiments, the quantum dots included in the first quantum dot pattern 531 and the second quantum dot pattern 533 may be formed of the same material, and the size of the quantum dot included in the first quantum dot pattern 531 may be larger than the size of the quantum dot included in the second quantum dot pattern 532.

The scattering pattern 532 may include TiO, ZrO, AlO3, In2O3, ZnO, SnO2, Sb2O3, ITO, or the like. However, the material of the scattering pattern 532 is not limited thereto and may be variously modified as long as the material scatters blue light without conversion.

Although the first quantum dot pattern 531, the second quantum dot pattern 533, and the scattering pattern 532 of the present inventive concept have been described as being sequentially arranged, the configuration of the present inventive concept is not limited thereto. For example, the arrangement of the first quantum dot pattern 531, the second quantum dot pattern 533, and the scattering pattern 532 may be changed.

Accordingly, the optical filters 530 including the first quantum dot pattern 531, the second quantum dot pattern 533, and the scattering pattern 532 may be disposed.

A second protective insulating layer 495 may be disposed under the optical filters 530 and the first protective insulating layer 490. The second protective insulating layer 495 may cover the optical filters 530 on the bottom of the first protective insulating layer 490. In exemplary embodiments, the second protective insulating layer 495 may come into direct contact with the first protective insulating layer 490 at a portion in which the optical filters 530 are spaced apart from each other. For example, the second protective insulating layer 495 may cover the optical filters 530 on the bottom surface of the first protective insulating layer 490 and may be disposed to have a uniform thickness along profiles of the optical filters 530. Alternatively, the second protective insulating layer 495 may sufficiently cover the optical filters 530 on the bottom surface of the first protective insulating layer 490 and may have a substantially planar top surface without generating a step around the optical filters 530. The second protective insulating layer 495 may include an inorganic material or an organic material. In other exemplary embodiments, the second protective insulating layer 495 may have a multi-layer structure including a plurality of insulating layers. For example, the insulating layers may have different thicknesses or include different materials.

A light blocking film 430 may be disposed on a bottom surface of the second protective insulating layer 495. The light blocking film 430 may be disposed at the portion in which the optical filters 530 are spaced apart from each other on the bottom surface of the second protective insulating layer 495. The light blocking film 430 may include a plurality of openings. For example, the light blocking film 430 may have a plate shape including a plurality of openings.

The light blocking film 430 may prevent a color mixture phenomenon that may occur in adjacent optical filters 530. For example, when the light blocking film 430 is not formed, some of the light incident to the second quantum dot pattern 533 may be incident to the first quantum dot pattern 531, and the remaining of the light may be incident to the scattering pattern 532. In this case, the color mixture phenomenon may occur. Alternatively, the light blocking film 430 may block or absorb light incident from the outside and may reflect light emitted from the light emitting layer 330. The light blocking film 430 and the light blocking layer 420 may include substantially the same material. For example, the light blocking film 430 may include an organic material and a light blocking material.

An intermediate layer 497 may be disposed under the light blocking layer 430 and the second protective insulating layer 495. The intermediate layer 497 may be disposed to cover the light blocking layer 430 on the bottom surface of the second protective insulating layer 495. For example, the intermediate layer 497 may be disposed relatively thickly to sufficiently cover the light blocking layer 430 on the bottom surface of the second protective insulating layer 495. In other words, the intermediate layer 497 may be disposed on the thin film encapsulation structure 450. The intermediate layer 497 may include an organic material, an inorganic material or the like.

A sealant may be disposed in the peripheral area 20 between the lower substrate 110 and the upper substrate 410. For example, the sealant may substantially surround the display area 10. The sealant may come into direct contact with the bottom surface of the upper substrate 410 and the top surface of the lower substrate 110. Alternatively, at least one insulating layer (such as the gate insulating layer 150, the interlayer insulating layer 190, the first inorganic thin film encapsulation layer 451, the second inorganic thin film encapsulation layer 453) may be interposed between the bottom surface of the sealant and the top surface of the lower substrate 110.

In exemplary embodiments, the sealant may include a non-conductive material. For example, the sealant may include a frit and the like. In addition, the sealant may further include a photocurable material. For example, the sealant may include a mixture of an organic material and a photocurable material, and the sealant may be obtained by curing the mixture after irradiating the mixture with ultraviolet rays (UV), laser light, visible light, or the like. The photocurable material included in the sealant may include epoxy acrylate-based resin, polyester acrylate-based resin, urethane acrylate-based resin, polybutadiene acrylate-based resin, silicone acrylate-based resin, alkyl acrylate-based resin, and the like.

For example, the mixture of the organic material and the photocurable material may be irradiated with laser beam. Upon the irradiation of laser beam, the mixture may be changed from a solid state to a liquid state, and the mixture in the liquid state may be cured in the solid state after a predetermined time. According to a change in state of the mixture, the upper substrate 410 may be coupled while being sealed to the lower substrate 110.

Accordingly, an upper structure 600, which includes a first protective insulating layer 490, a second protective insulating layer 495, a plurality of optical filters 530, an intermediate layer 497, a plurality of color filters 510, a light blocking layer 420, a light blocking film 430, and an upper substrate 410 may be provided, and the display device 100 including the lower structure 500 and the upper structure 600 shown in FIG. 8 may be provided.

Although the display device 100 of the present inventive concept has been described as an organic light emitting display device, the configuration of the present inventive concept is not limited thereto. In other exemplary embodiments, the display device 100 may include a liquid crystal display (LCD), a field emission display (FED), a plasma display panel (PDP), and an electrophoretic display device (EPD). For example, the upper substrate 410 disposed thereon with the optical filters 530 and the color filters 510 may be used as an upper substrate for the liquid crystal display device, the field emission display device, the plasma display device, and the electrophoretic image display device.

FIGS. 9 to 15 are sectional views showing a method of manufacturing the display device according to the exemplary embodiments of the present inventive concept.

Figure 9:
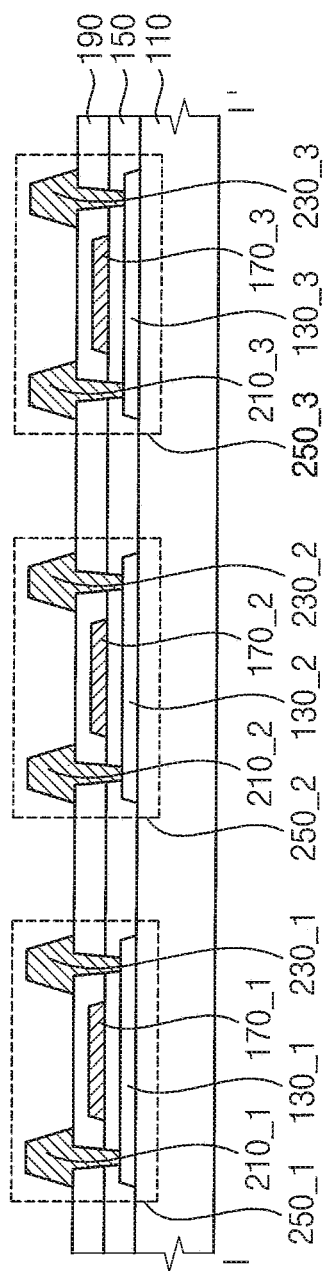
FIGS. 9, 10, 11, 12, 13, 14 and 15 are sectional views showing a method of manufacturing the display device according to the exemplary embodiments of the present inventive concept.

Referring to FIG. 9, the lower substrate 110 including a transparent or opaque material may be provided. The lower substrate 110 may be formed using a quartz substrate, a synthetic quartz substrate, a calcium fluoride substrate, a fluorine-doped quartz substrate, a soda-lime glass substrate, a non-alkali glass substrate, or the like.

Alternatively, the lower substrate 110 may be formed of a transparent resin substrate having flexibility. An example of the transparent resin substrate that can be used for the lower substrate 110 includes a polyimide substrate. In this case, the polyimide substrate may be composed of a first polyimide layer, a barrier film layer, a second polyimide layer, and the like. For example, the polyimide substrate may have a configuration in which a first polyimide layer, a barrier film layer, and a second polyimide layer are sequentially laminated on a hard glass substrate. In the method of manufacturing the display device, after an insulating layer (such as a buffer layer) is formed on the second polyimide layer of the polyimide substrate, semiconductor devices, sub-pixel structures, and the like may be formed on the insulating layer. After the semiconductor devices and the sub-pixel structure are formed, the hard glass substrate may be removed. In other words, since the polyimide substrate is thin and flexible, it may be difficult to provide the semiconductor elements and the sub-pixel structure directly on the polyimide substrate. Considering the above difficulty, the polyimide substrate may be used as the lower substrate 110 by using the hard glass substrate to form the semiconductor elements and the sub-pixel structure and then removing the glass substrate.

The buffer layer (not shown) may be formed on the lower substrate 110. The buffer layer may be formed entirely on the lower substrate 110. According to a type of substrate 110, at least two buffer layers may be provided on the substrate 110, or the buffer layer may not be formed thereon. For example, the buffer layer may be formed using an organic material or an inorganic material.

The first to third active layers 1301, 1302, and 130_3 may be formed on the lower substrate 110 on the buffer layer while being spaced apart from each other. Each of the first to third active layers 130_1, 130_2, and 130_3 may be formed using an oxide semiconductor, an inorganic semiconductor or an organic semiconductor, and may include a source area and a drain area. The first to third active layers 130_1, 130_2, and 1303 may be simultaneously formed using the same material.

The gate insulating layer 150 may be formed on the first to third active layers 130_1, 130_2, and 130_3. The gate insulating layer 150 may cover the first to third active layers 130_1, 130_2, and 130_3 on the lower substrate 110, and may be formed entirely on the lower substrate 110. For example, the gate insulating layer 150 may sufficiently cover the first to third active layers 130_1, 130_2, and 130_3 on the lower substrate 110, and may have a substantially planarized top surface without generating a step around the first to third active layers 130_1, 130_2, and 130_3. Alternatively, the gate insulating layer 150 may cover the first to third active layers 130_1, 130_2, and 130_3 on the lower substrate 110, and may be formed to have a uniform thickness along profiles of the first to third active layers 130_1, 130_2, and 130_3. The gate insulating layer 150 may be formed using a silicon compound, metal oxide or the like. For example, the gate insulating layer 150 may include SiO, SiN, SiON, SiOC, SiCN, SiOC, AlO, AlN, TaO, HfO, ZrO, TiO, and the like.

The first to third gate electrodes 170_1, 170_2, and 170_3 may be formed to be spaced apart from each other on the gate insulating layer 150. For example, the first gate electrode 170_1 may be formed on a portion of the gate insulating layer 150 under which the first active layer 130_1 is disposed, the second gate electrode 170_2 may be formed on a portion of the gate insulating layer 150 under which the second active layer 130_2 is disposed, and the third gate electrode 170_3 may be disposed on a portion of the gate insulating layer 150 under which the third active layer 130_3 is disposed. Each of the first to third gate electrodes 170_1, 170_2, and 170_3 may be formed by using a metal, an alloy, a metal nitride, a conductive metal oxide, a transparent conductive material, or the like. For example, each of the first to third gate electrodes 170_1, 170_2, and 170_3 may include Au, Ag, Al, Pt, Ni, Ti, Pd, Mg, Ca, Li, Cr, Ta, W, Cu, Mo, Sc, Nd, Ir, an alloy containing aluminum, AlN, an alloy containing silver, WN, an alloy containing copper, an alloy containing molybdenum, TiN, CrN, TaN, SrRuO, ZnO, ITO, SnO, InO, GaO, IZO, and the like. These may be used individually or in combination.

The interlayer insulating layer 190 may be formed on the first to third gate electrodes 170_1, 170_2, and 170_3. The interlayer insulating layer 190 may cover the first to third gate electrodes 170_1, 170_2, and 170_3 on the gate insulating layer 150 and may be formed entirely on the gate insulating layer 150. For example, the interlayer insulating layer 190 may sufficiently cover the first to third gate electrodes 170_1, 170_2, and 170_3 on the gate insulating layer 150 and may have a substantially planarized top surface without generating a step around the first to third gate electrodes 170_1, 170_2, and 170_3. Alternatively, the interlayer insulating layer 190 may cover the first to third gate electrodes 170_1, 170_2, and 170_3 on the gate insulating layer 150 and may be formed to have a uniform thickness along profiles of the first to third gate electrodes 170_1, 170_2, and 170_3. The interlayer insulating layer 190 may be formed using a silicon compound, metal oxide or the like.

A first source electrode 210_1, a first drain electrode 230_1, a second source electrode 210_2, a second drain electrode 230_2, a third source electrode 2103, and a third drain electrode 230_3 may be formed on the interlayer insulating layer 190 while being spaced apart from each other. For example, the first source electrode 210_1 may be connected to the source area of the first active layer 130_1 through a contact hole formed by removing first portions of the gate insulating layer 150 and the interlayer insulating layer 190, and the first drain electrode 230_1 may be connected to the drain area of the first active layer 130_1 through a contact hole formed by removing second portions of the gate insulating layer 150 and the interlayer insulating layer 190. In addition, the second source electrode 210_2 may be connected to the source area of the second active layer 130_2 through a contact hole formed by removing third portions of the gate insulating layer 150 and the interlayer insulating layer 190, and the second drain electrode 230_2 may be connected to the drain area of the second active layer 130_2 through a contact hole formed by removing fourth portions of the gate insulating layer 150 and the interlayer insulating layer 190. Further, the third source electrode 210_3 may be connected to the source area of the third active layer 130_3 through a contact hole formed by removing fifth portions of the gate insulating layer 150 and the interlayer insulating layer 190, and the third drain electrode 230_3 may be connected to the drain area of the third active layer 130_3 through a contact hole formed by removing sixth portions of the gate insulating layer 150 and the interlayer insulating layer 190. The first to third source electrodes 210_1, 210_2, and 210_3 and the first to third drain electrodes 230_1, 230_2, and 230_3 may be formed by using a metal, an alloy, a metal nitride, a conductive metal oxide, a transparent conductive material, or the like. These may be used individually or in combination. In other words, the first to third source electrodes 210_1, 210_2, and 210_3 and the first to third drain electrodes 230_1, 230_2, and 230_3 may be simultaneously formed using the same material.

Accordingly, the first semiconductor element 250_1 including the first active layer 130_1, the first gate electrode 170_1, the first source electrode 210_1 and the first drain electrode 230_1 may be disposed, the second semiconductor element 250_2 including the second active layer 130_2, the second gate electrode 170_2, the second source electrode 210_2 and the second drain electrode 230_2 may be disposed, and the third semiconductor element 250_3 including the third active layer 130_3, the third gate electrode 1703, the third source electrode 210_3 and the third drain electrode 230_3 may be disposed.

Figure 10:
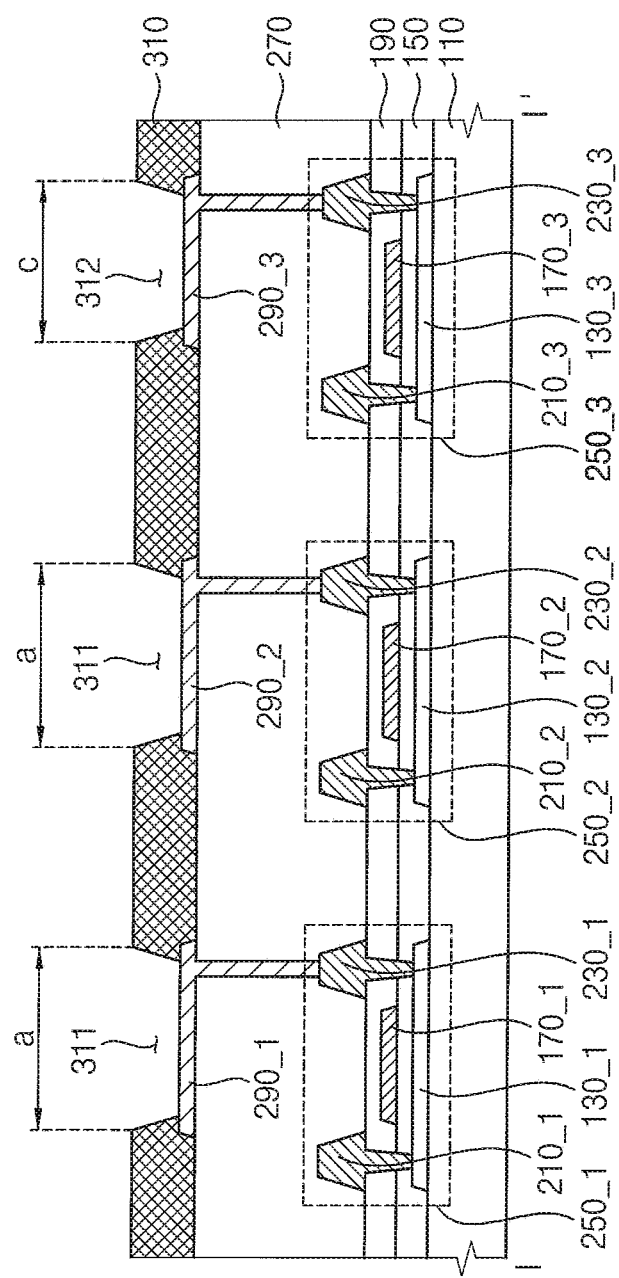

Referring to FIG. 10, the planarization layer 270 may be formed on the interlayer insulating layer 190 and the first to third semiconductor elements 250_1, 250_2 and 250_3. For example, the planarization layer 270 may be relatively thickly formed to sufficiently cover the first to third source electrodes 210_1, 210_2, and 210_3 and the first to third drain electrodes 230_1, 230_2, and 230_3 on the interlayer insulating layer 190. In this case, the planarization layer 270 may have a substantially planar top surface, and a planarization process may be added to the planarization layer 270 to implement the above planar top surface of the planarization layer 270. The planarization layer 270 may be formed using an organic material.

The first to third lower electrodes 290_1, 290_2, and 290_3 may be formed on the planarization layer 270 while being spaced apart from each other. The first to third lower electrodes 290_1, 290_2, and 290_3 may be connected to the first to third drain electrodes 2301, 230_2, and 230_3 via contact holes formed through the planarization layer 270, respectively. The first to third lower electrodes 290_1, 290_2, and 290_3 may be formed by using a metal, an alloy, a metal nitride, a conductive metal oxide, a transparent conductive material, or the like. These may be used individually or in combination. In other words, the first to third lower electrodes 290_1, 290_2, and 290_3 may be simultaneously formed using the same material.

The pixel defining film 310 may be formed on each of the first to third lower electrodes 290_1, 290_2, and 290_3 and on the planarization layer 270. The pixel defining film 310 may cover edges of each of the first to third lower electrodes 290_1, 290_2, and 290_3, and may expose a part of each top surface of the first to third lower electrodes 290_1, 290_2, and 290_3. In other words, the pixel defining film 310 may include pixel openings 311 exposing a part of each top surface of the first and second lower electrodes 290_1 and 290_2 and a small pixel opening 312 exposing a part of a top surface of the third lower electrode 290_3. In exemplary embodiments, each of the pixel openings 311 may have a first width a, and the small pixel opening 312 may have a third width c. The first width a may be larger than the third width c. The pixel defining film 310 may be formed using an organic material.

Referring to FIG. 11, the light emitting layer 330 may be formed on the first to third lower electrodes 290_1, 290_2, and 290_3 exposed by openings in the pixel defining film 310. In other words, the light emitting layer 330 may be continuously (or integrally) formed on the lower substrate 110. In exemplary embodiments, the light emitting layer 330 may be formed using a light emitting material capable of emitting blue light. In contrast, the light emitting layer 330 may be formed by laminating a plurality of light emitting materials capable of generating different color light such as red light, green light and blue light, such that white light may be entirely emitted.

The upper electrode 340 may be formed in the display area 10 on the pixel defining film 310 and the light emitting layer 330. The upper electrode 340 may be formed by using a metal, an alloy, a metal nitride, a conductive metal oxide, a transparent conductive material, or the like. These may be used individually or in combination.

Accordingly, the first sub-pixel structure including the first lower electrode 290_1, the light emitting layer 330, and the upper electrode 340 may be disposed on the lower substrate 110, the second sub-pixel structure including the second lower electrode 290_2, the light emitting layer 330, and the upper electrode 340 may be disposed on the lower substrate 110, and the third sub-pixel structure including the third lower electrode 290_3, the light emitting layer 330, and the upper electrode 340 may be disposed on the lower substrate 110.

The first inorganic thin film encapsulation layer 451 may be formed on the upper electrode 340. The first inorganic thin film encapsulation layer 451 may be formed to have a uniform thickness along a profile of the upper electrode 340 while covering the upper electrode 340. The first inorganic thin film encapsulation layer 451 may be formed by using flexible inorganic materials.

The organic thin film encapsulation layer 452 may be formed on the first inorganic thin film encapsulation layer 451. The organic thin film encapsulation layer 452 may include flexible organic materials.

The second inorganic thin film encapsulation layer 453 may be formed on the organic thin film encapsulation layer 452. The second inorganic thin film encapsulation layer 453 may be formed to have a uniform thickness along the profile of the organic thin film encapsulation layer 452 while covering the organic thin film encapsulation layer 452. The second inorganic thin film encapsulation layer 453 may be formed by using the flexible inorganic materials.

Accordingly, the thin film encapsulation structure 450 including a first inorganic thin film encapsulation layer 451, an organic thin film encapsulation layer 452, and a second inorganic thin film encapsulation layer 453 may be formed, and a lower structure 500, which includes the lower substrate 110, the first semiconductor element 250_1, the second semiconductor element 2502, the third semiconductor element 2503, the gate insulating layer 150, the interlayer insulating layer 190, the planarization layer 270, the first lower electrode 290_1, the second lower electrode 290_2, the third lower electrode 290_3, the pixel defining film 310, the light emitting layer 330, the upper electrode 340, and the thin film encapsulation structure 450, may be provided.

Figure 12:
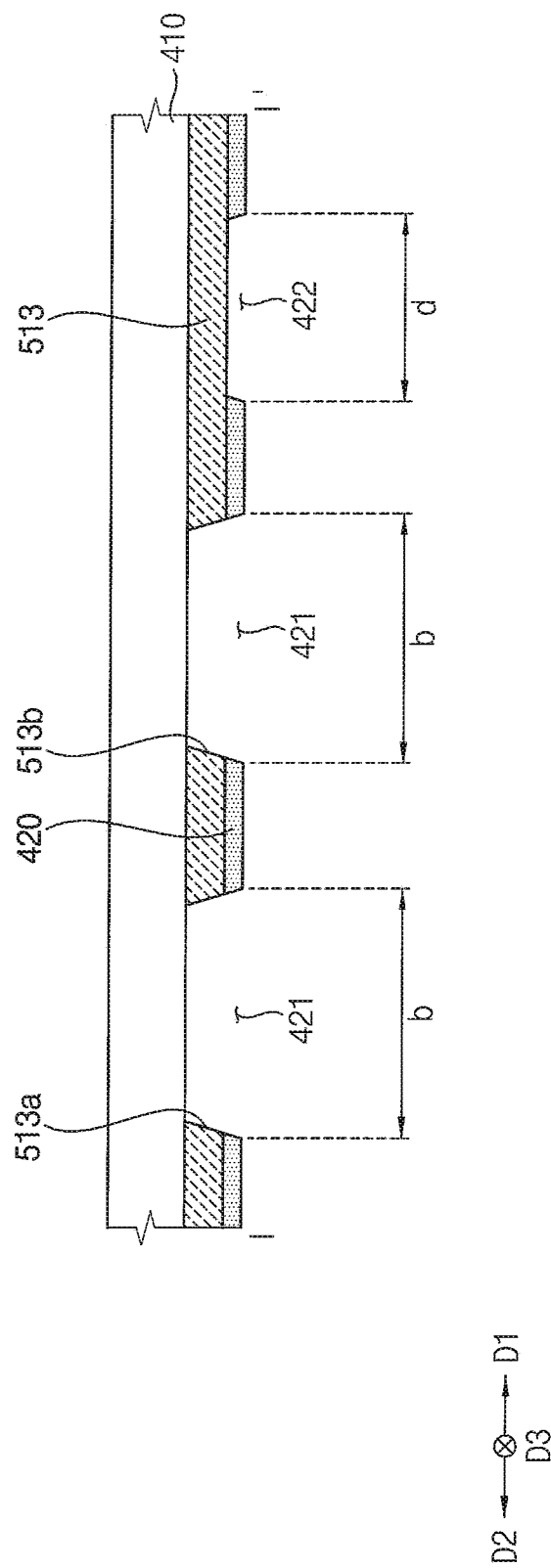

Referring to FIG. 12, the upper substrate 410 may be provided. The upper substrate 410 and the lower substrate 110 may include substantially the same material. For example, the upper substrate 410 may be formed using a quartz substrate, a synthetic quartz substrate, a calcium fluoride substrate, a fluorine-doped quartz substrate, a soda-lime glass substrate, a non-alkali glass substrate, or the like.

A color filter 513 may be formed on the bottom surface of the upper substrate 410. The first color filter 513 may have openings 513a and 513b. In exemplary embodiments, the first color filter 513 may transmit blue light, and may be a color filter having a blue color.

The light blocking layer 420 may be formed on a bottom surface of the first color filter 512. The light blocking layer 420 may include openings 421 and small openings 422. For example, the light blocking layer 420 may have a plate shape including the openings 421 and the small openings 422. In addition, the openings 421 of the light blocking layer 420 may completely expose the openings 513a and 513b of the first color filter 513, and the small opening 422 may expose a part of the bottom surface of the first color filter 513. In other words, the part exposed by the small opening 422 in the first color filter 513 may function as a color filter. In exemplary embodiments, each of the openings 421 of the light blocking layer 420 may have a second width b, and the small opening 422 of the light blocking layer 420 may have a fourth width d. The second width b may be larger than the fourth width d, the second width b may be larger than the first width a, and the fourth width d may be larger than the third width c.

The light blocking layer 420 may block or absorb light incident from the outside. The light blocking layer 420 may be formed using an organic material such as photoresist, polyacryl-based resin, polyimide-based resin, polyamide-based resin, siloxane-based resin, acryl-based resin, and epoxy-based resin. In addition, the light blocking layer 420 may be substantially opaque. For example, the light blocking layer 420 may further include a light blocking material to absorb light. The light blocking material may include carbon black, titanium nitride oxide, titanium black, phenylene black, aniline black, cyanine black, nigrosine acid black, black resin, and the like.

Figure 13:
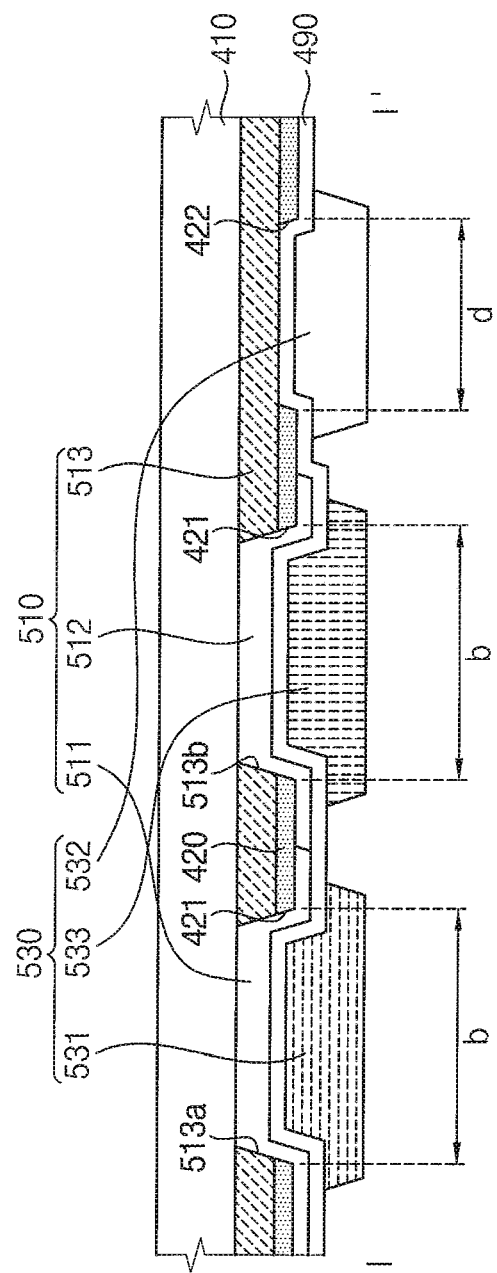

Referring to FIG. 13, a second color filter 511 may be formed in the opening 513a of the first color filter 513 on the bottom surface of the upper substrate 410 and the opening 421 of the light blocking layer 420 overlapping the opening 513a. A part of the second color filter 511 may also be formed on a part of a bottom surface of the light blocking layer 420. In exemplary embodiments, the second color filter 511 may transmit red light, and may be a color filter having a red color.

A third color filter 513 may be formed in the opening 513b of the first color filter 513 on the bottom surface of the upper substrate 410 and the opening 421 of the light blocking layer 420 overlapping the opening 513b. A part of the third color filter 512 may also be formed on a part of a bottom surface of the light blocking layer 420 and may come into contact with or overlap with the second color filter 511 on the bottom surface of the light blocking layer 420. In exemplary embodiments, the third color filter 512 may transmit green light, and may be a color filter having a green color.

Accordingly, the color filters 510 which include the first color filter 513, the second color filter 511, and the third color filter 512, may be formed. The color filters 510 may be formed using photosensitive resin or color photoresist.

A first protective insulating layer 490 may be formed under the color filters 510 and the light blocking layer 420. The first protective insulating layer 490 may cover the color filters 510 and the light blocking layer 420 on the bottom surface of the upper substrate 410. For example, the first protective insulating layer 490 may cover the color filters 510 and the light blocking layer 420 on the bottom surface of the upper substrate 410 and may be formed to have a uniform thickness along profiles of the color filters 510 and the light blocking layer 420. Alternatively, the first protective insulating layer 490 may sufficiently cover the color filters 510 and the light blocking layer 420 on the bottom surface of the upper substrate 410 and may have a substantially planar top surface without generating a step around the color filters 510 and the light blocking layer 420. The first protective insulating layer 490 may be formed using an inorganic material or an organic material.

Optical filters 530 may be formed on a bottom surface of the first protective insulating layer 490 while overlapping the color filters 510. The optical filters 530 may include a first quantum dot pattern 531 for converting blue light into red light, a second quantum dot pattern 533 for converting blue light into green light and a scattering pattern 532 for transmitting blue light.

The first quantum dot pattern 531 may be formed under the second color filter 511 while overlapping the second color filter 511, the second quantum dot pattern 533 may be formed under the third color filter 512 while overlapping the third color filter 512, and the scattering pattern 532 may be formed under the first color filter 513 while overlapping the first color filter 513. In exemplary embodiments, the first quantum dot pattern 531, the second quantum dot pattern 533, and the scattering pattern 532 may be spaced apart from each other and may be positioned on the same layer. The first quantum dot pattern 531 may include a plurality of quantum dots that absorb blue light and emit red light, the second quantum dot pattern 533 may include a plurality of quantum dots that absorb blue light and emit green light, and the scattering pattern 532 may include a scattering material that emits blue light as received from the light emitting layer 330.

For example, the quantum dots included in the first quantum dot pattern 531 and the second quantum dot pattern 533 may be formed using any one among silicon-based nanocrystal, II-VI group-based compound semiconductor nanocrystal, III-V group-based compound semiconductor nanocrystal, IV-VI group-based compound semiconductor nanocrystal, and a mixture thereof.

Even when the quantum dots included in the first and second quantum dot patterns 531 and 533 include the same material, a spectrum wavelength may vary according to a size of the quantum dot. For example, when the size of the quantum dot is smaller, light having a shorter wavelength may be emitted. Accordingly, the sizes of the quantum dots included in the first and second quantum dot patterns 531 and 533 are adjusted so that light having a desired visible light zone may be emitted.

The scattering pattern 532 may be formed using TiO, ZrO, AlO3, In2O3, ZnO, SnO2, Sb2O3, ITO, or the like. However, the material of the scattering pattern 532 is not limited thereto and may be variously modified as long as the material scatters blue light without altering a wavelength of light received from the light emitting layer 330.

Accordingly, the optical filters 530, which include a first quantum dot pattern 531, a second quantum dot pattern 533, and a scattering pattern 532, may be formed.

Referring to FIG. 14, a second protective insulating layer 495 may be formed under the optical filters 530 and the first protective insulating layer 490. The second protective insulating layer 495 may cover the optical filters 530 on the bottom of the first protective insulating layer 490. In exemplary embodiments, the second protective insulating layer 495 may come into direct contact with the first protective insulating layer 490 at a portion in which the optical filters 530 are spaced apart from each other. For example, the second protective insulating layer 495 may cover the optical filters 530 on the bottom surface of the first protective insulating layer 490 and may be formed to have a uniform thickness along profiles of the optical filters 530. Alternatively, the second protective insulating layer 495 may sufficiently cover the optical filters 530 on the bottom surface of the first protective insulating layer 490 and may have a substantially planar top surface without generating a step around the optical filters 530. The second protective insulating layer 495 may be formed using an inorganic material or an organic material.

A light blocking film 430 may be formed on a bottom surface of the second protective insulating layer 495. The light blocking film 430 may be formed at the portion in which the optical filters 530 are spaced apart from each other on the bottom surface of the second protective insulating layer 495. The light blocking film 430 may include a plurality of openings. For example, the light blocking film 430 may have a plate shape including a plurality of openings.

The light blocking film 430 may prevent a color mixture phenomenon that may occur in adjacent optical filters 530. For example, when the light blocking film 430 is not formed, some of the light incident to the second quantum dot pattern 533 may be incident to the first quantum dot pattern 531, and the remaining of the light may be incident to the scattering pattern 532. In this case, the color mixture phenomenon may occur. Alternatively, the light blocking film 430 may block or absorb light incident from the outside and may reflect light emitted from the light emitting layer 330. The light blocking film 300 and the light blocking layer 420 may include substantially the same material. For example, the light blocking film 430 may be formed using an organic material and a light blocking material.

An intermediate layer 497 may be formed under the light blocking layer 430 and the second protective insulating layer 495. The intermediate layer 497 may be formed to cover the light blocking layer 430 on the bottom surface of the second protective insulating layer 495. For example, the intermediate layer 497 may be formed relatively thickly to sufficiently cover the light blocking layer 430 on the bottom surface of the second protective insulating layer 495. The intermediate layer 497 may be formed using an organic material, an inorganic material, or the like.

Accordingly, an upper structure 600, which includes a first protective insulating layer 490, a second protective insulating layer 495, a plurality of optical filters 530, an intermediate layer 497, a plurality of color filters 510, a light blocking layer 420, a light blocking film 430, and an upper substrate 410, may be provided.

The sealant may be formed in the peripheral area 20 on the lower substrate 110. Alternatively, the sealant may be formed in the peripheral area 20 on the upper substrate 410. The sealant may be formed using a non-conductive material. For example, the sealant may include a frit and the like. In addition, the sealant may further include a photocurable material. For example, the sealant may include a mixture of an organic material and a photocurable material. The photocurable material included in the sealant may include epoxy acrylate-based resin, polyester acrylate-based resin, urethane acrylate-based resin, polybutadiene acrylate-based resin, silicone acrylate-based resin, alkyl acrylate-based resin, and the like.

Figure 15:
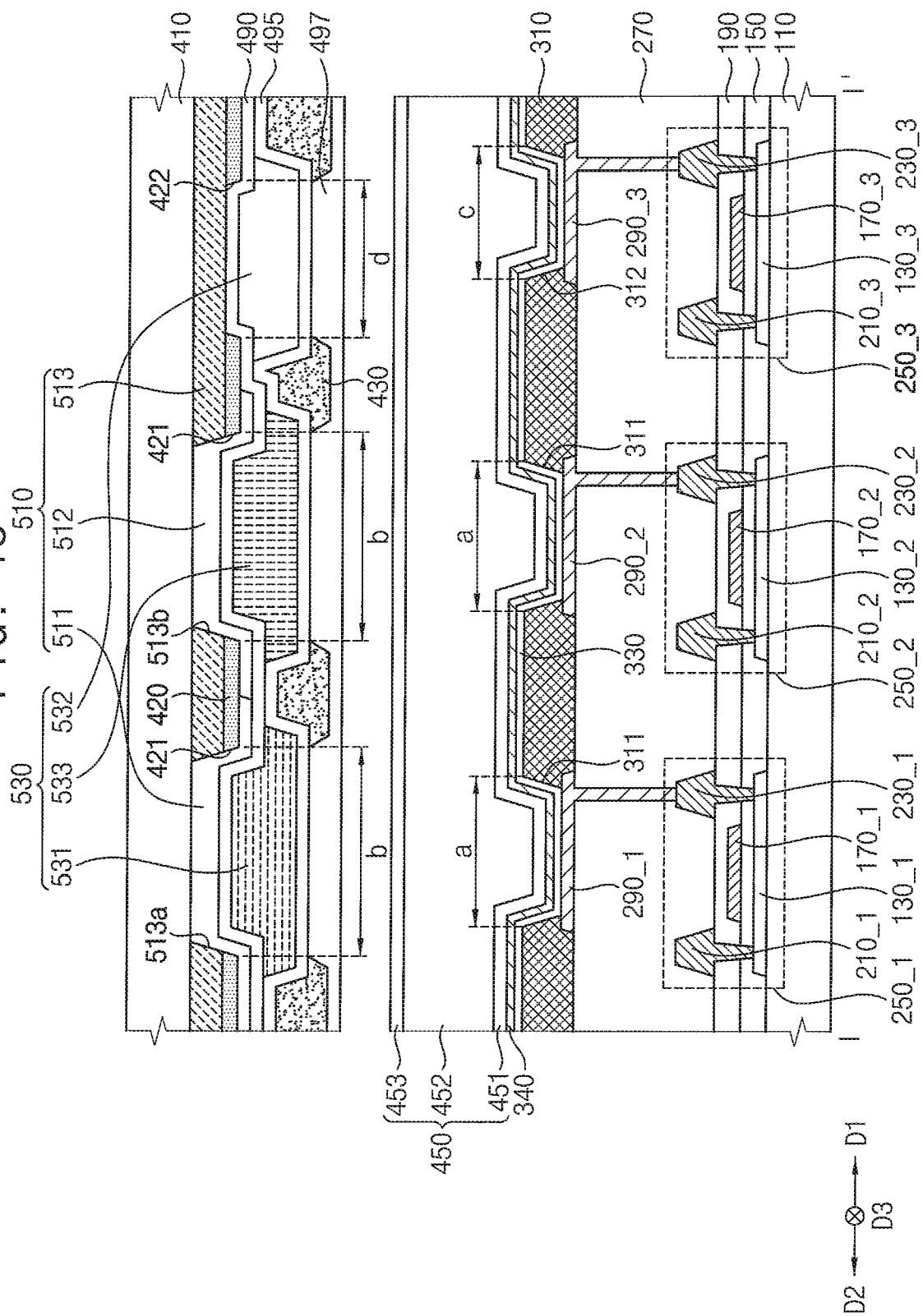

Referring to FIG. 15, after the sealant is formed, the bottom surface of the upper substrate 410 may come into contact with the sealant. When the lower structure 500 is coupled to the upper structure 600, a misalignment may occur.

For example, referring to FIGS. 6, 7 and 15, when the upper structure 600 is shifted in the second direction D2 due to a misalignment, an overlapping area between the first small pixel opening 312_1 and the first small opening 422_1 may increase, and an overlapping area between the second small pixel opening 312_2 and the second small opening 422_2 may decrease. In contrast, when the upper structure 600 is shifted in the first direction D1 due to a misalignment occurs, an overlapping area between the first small pixel opening 312_1 and the first small opening 422_1 may decrease, and an overlapping area between the second small pixel opening 312_2 and the second small opening 422_2 may increase. In other words, when the light emitted from the light emitting layer 330 is discharged to the outside through the first small opening 422_1 and the second small opening 422_2, the total area of light discharged to the outside may be constant regardless of the misalignment. In other words, when the first small pixel opening 312_1 and the second small pixel opening 312_2 partially overlap the first small opening 422_1 and the second small opening 422_2, respectively, the total area of the light discharged to the outside may be maintained to have a predetermined level even when the misalignment occurs. However, when a misalignment occurs in which the first small opening 422_1 is shifted in the first direction D1 and overlaps the third pixel opening 311_3, or when a misalignment occurs in which the second small opening 422_2 is shifted in the second direction D2 and overlaps the fourth pixel opening 311_4, the total amount of light discharged to the outside may be changed. Accordingly, a maximum distance in the first direction D1 without overlapping the third pixel opening 311_3 and the first small opening 422_1 may be defined as a process margin for the misalignment in the first direction, and a maximum distance in the second direction D2 without overlapping the fourth pixel opening 311_4 and the second small opening 422_2 may be defined as a process margin for the misalignment in the second direction.

Then, ultraviolet rays, laser light, visible light, or the like may be irradiated onto the sealant. For example, a laser beam may be irradiated onto the sealant. Upon the irradiation of laser beam, the mixture may be changed from a solid state to a liquid state, and the mixture in the liquid state may be cured in the solid state after a predetermined time. According to a change in state of the mixture, the upper substrate 410 may be coupled while being sealed to the lower substrate 110.

Accordingly, the display device 100 shown in FIGS. 1 to 8 may be manufactured.

The method of manufacturing the display device according to the exemplary embodiments of the present inventive concept may reduce a defect rate due to misalignment in the horizontal direction (for example, the first direction D1 or the second direction D2), when the upper structure 600 is coupled to the lower structure 500.

Figure 16:
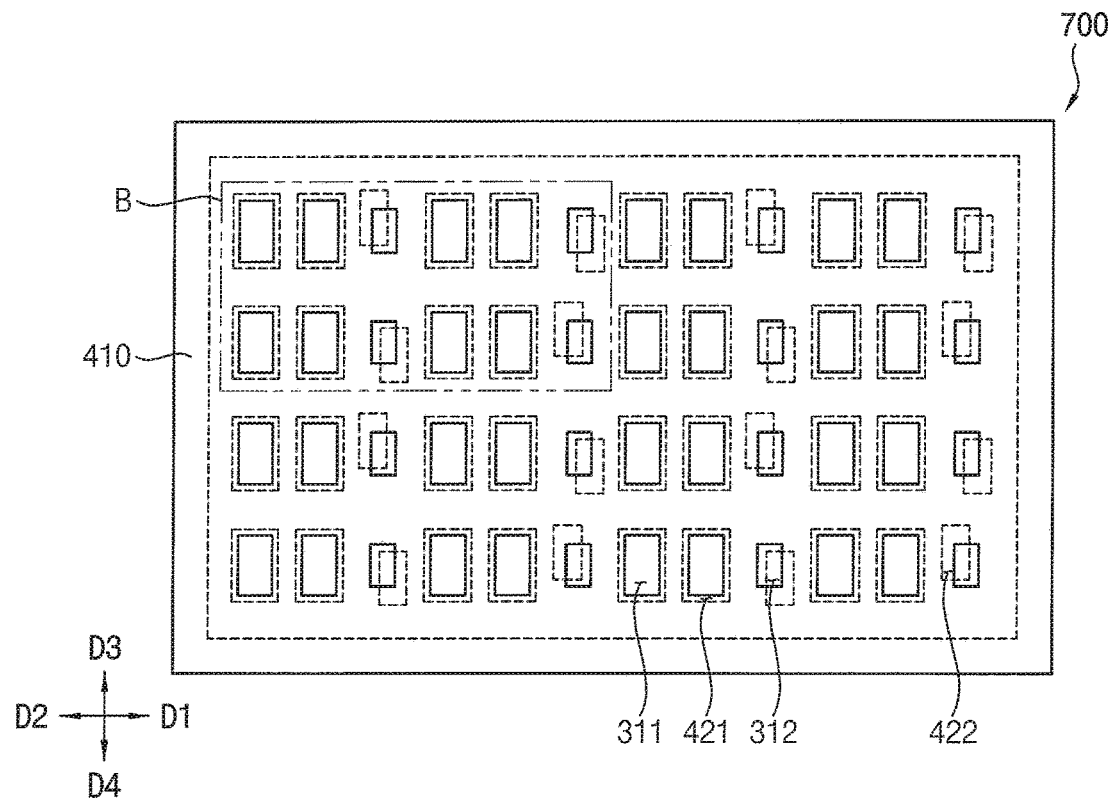
FIG. 16 is a plan view showing a display device according to exemplary embodiments of the present inventive concept.
Figure 17:
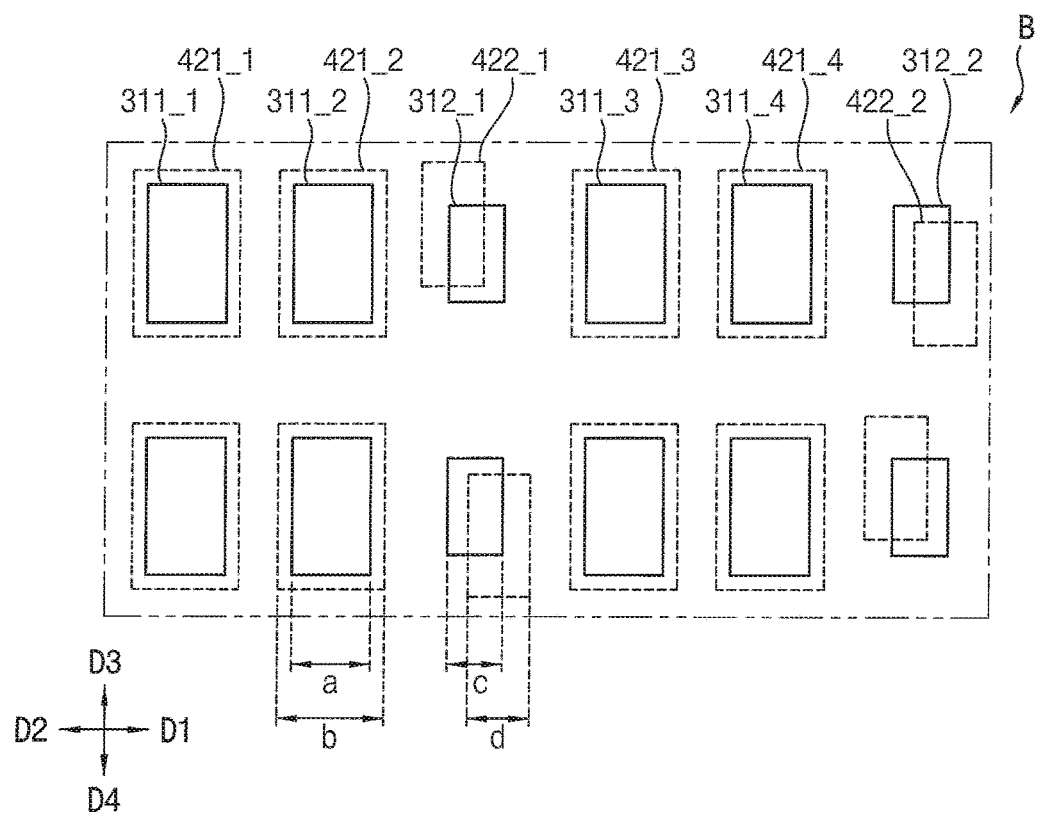
FIG. 17 is an enlarged plan view showing an area 'B' of FIG. 16.
Figure 18:
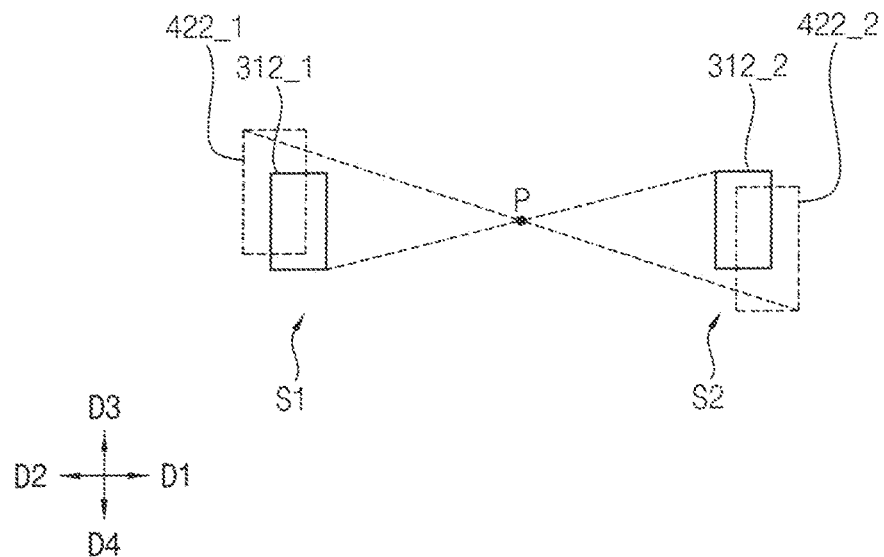
FIG. 18 is a plan view showing a shape in which openings of the pixel defining film overlap openings of the light blocking layer included in the display device of FIG. 17.

FIG. 16 is a plan view showing a display device according to exemplary embodiments of the present inventive concept. FIG. 17 is a partially enlarged plan view enlarging and showing an area 'B' of FIG. 16. FIG. 18 is a plan view showing a shape in which openings of the pixel defining film overlap openings of the light blocking layer included in the display device of FIG. 17. The display device 700 illustrated in FIGS. 16 and 17 may have a configuration substantially the same as or similar to the display device 100 described with reference to FIGS. 1 to 8, except for the first shape S1 in which the first small pixel opening 312_1 overlaps the first small opening 422_1 and the second shape S2 in which the second small pixel opening 312_2 overlaps the second small opening 422_2. In FIGS. 16 to 18, duplicate descriptions for components substantially the same as or similar to the components described with reference to FIGS. 1 to 8 will be omitted.

Referring to FIGS. 16, 17 and 18, when viewed in the direction perpendicular to the top surface of the upper substrate 410, the pixel openings 311 and the openings 421 may be disposed to overlap each other. For example, the openings 421 may completely cover the pixel openings 311, respectively. In addition, when viewed in the direction perpendicular to the top surface of the upper substrate 410, the small pixel openings 312 may be partially exposed by the small openings 422, respectively. In other words, the small pixel openings 312 may be partially covered by the light blocking layer 420, respectively. In exemplary embodiments, some of the small openings 422 may be shifted in the second direction D2 and in the third direction D3 on the small pixel openings 312 so as not to expose a bottom right portion of the small pixel openings 312, respectively, and the remaining of the small openings 422 may be shifted in the first direction D1 and the fourth direction D4 on the small pixel openings 312 so as not to expose a top left portion of the small pixel openings 312, respectively.

For example, as shown in FIG. 17, the pixel openings 311 may include a first pixel opening 311_1, a second pixel opening 311_2, a third pixel opening 311_3, and a fourth pixel opening 311_4, and the small pixel openings 312 may include a first small pixel opening 312_1 and a second small pixel opening 312_2. In addition, the openings 421 may include a first opening 421_1, a second opening 421_2, a third opening 421_3, and a fourth opening 421_4, and the small openings 422 may include a first small opening 422_1 and a second small opening 422_2.

The first pixel opening 311_1, the second pixel opening 311_2, and the first small pixel opening 312_1 may be disposed in an area corresponding to the first pixel area, and the third pixel opening 311_3, the fourth pixel opening 311_4, and the second small pixel opening 312_2 may be disposed in an area corresponding to a second pixel area adjacent to the first pixel area along a first direction.

In exemplary embodiments, light emitted from a light emitting layer disposed on a first small pixel opening 312_1 and light emitted from a light emitting layer disposed on the second small pixel opening 312_2 may have the same color, or a color in which the light emitted from the light emitting layer disposed on the first small pixel opening 312_1 is discharged to the outside of the display device 100 through the first small opening 422_1 may be the same as a color in which the light emitted from the light emitting layer disposed on the second small pixel opening 312_2 is discharged to the outside of the display device 100 through the second small opening 422_2.

In addition, light emitted from a light emitting layer disposed on the first pixel opening 311_1 and light emitted from a light emitting layer disposed on the third pixel opening 311_3 may have the same color, or a color in which the light emitted from the light emitting layer disposed on the first pixel opening 311_1 is discharged to the outside of the display device 100 through the first opening 421_1 may be the same as a color in which the light emitted from the light emitting layer disposed on the third pixel opening 311_3 is discharged to the outside of the display device 100 through the third opening 421_3.

Further, light emitted from a light emitting layer disposed on the second pixel opening 311_2 and light emitted from a light emitting layer disposed on the fourth pixel opening 311_4 may have the same color, or a color in which the light emitted from the light emitting layer disposed on the second pixel opening 311_2 is discharged to the outside of the display device 100 through the second opening 421_2 may be the same as a color in which the light emitted from the light emitting layer disposed on the fourth pixel opening 311_4 is discharged to the outside of the display device 100 through the fourth opening 421_4.

Each of the first pixel opening 311_1, the second pixel opening 311_2, the third pixel opening 311_3, and the fourth pixel opening 311_4 may have a first width a, and each of the first opening 421_1, the second opening 421_2, the third opening 421_3, and the fourth opening 421_4 may have a second width b. The width a may be smaller than the second width b. In addition, each of the first small pixel opening 312_1 and the second small pixel opening 312_2 may have a third width c, and each of the first small opening 422_1 and the second small opening 422_2 may have a fourth width d. The third width c may be smaller than the fourth width d.

The first opening 421_1, the second opening 421_2, the third opening 421_3, and the fourth opening 421_4 may overlap the first pixel opening 311_1, the second pixel opening 311_2, the third pixel opening 311_3, and the fourth pixel opening 311_4, respectively. In other words, the first opening 421_1, the second opening 421_2, the third opening 421_3, and the fourth opening 421_4 may completely expose the first pixel opening 311_1, the second pixel opening 311_2, the third pixel opening 311_3, and the fourth pixel opening 311_4, respectively. In other words, sizes of the first opening 421_1, the second opening 421_2, the third opening 421_3, and the fourth opening 421_4 may be larger than sizes of the first pixel opening 311_1, the second pixel opening 311_2, the third pixel opening 311_3, and the fourth pixel opening 311_4, respectively.

In contrast, the first small opening 422_1 and the second small opening 422_2 may partially expose the first small pixel opening 312_1 and the second small pixel opening 312_2, respectively. In other words, the light blocking layer 420 may partially expose the first small pixel opening 312_1 and the second small pixel opening 312_2, respectively.

In exemplary embodiments, the second small pixel opening 312_2 may be spaced apart from the first small pixel opening 312_1 in the first direction D1, and the second small opening 422_2 may be spaced apart from the first small opening 422_1 in the first direction D1.

A right portion and a lower portion of each of the first small pixel opening 312_1 and the second small pixel opening 312_2 are defined as a first portion and a left portion and an upper portion thereof are defined as a second portion.

The first small opening 422_1 may be shifted in the second direction D2 and the third direction D3 on the first small pixel opening 312_1 so as not to expose the second portion of the first small pixel opening 312_1, and the second small opening 422_2 may be shifted in the first direction D1 and the fourth direction D4 on the second small pixel opening 312_2 so as not to expose the first portion of the second small pixel opening 312_2.

In exemplary embodiments, as shown in FIG. 18, when viewed in the direction perpendicular to the top surface of the upper substrate 410, a first shape S1 in which the first small pixel opening 312_1 overlaps the first small opening 422_1 and a second shape S2 in which the second small pixel opening 312_2 overlaps the second small opening 422_2 may be symmetrical to each other about a point of symmetry (P). The point of symmetry (P) may be a point in which a figure can be rotated 180° about the point of symmetry (P) and end up looking identical to the original.

In exemplary embodiments, the display device 700 may include a first small opening 422_1 and a second small opening 422_2 partially exposing a first small pixel opening 312_1 and a second small pixel opening 312_2, respectively. In addition, when viewed in the direction perpendicular to the top surface of the upper substrate 410, a first shape S1 in which the first small opening 422_1 exposes the first small pixel opening 312_1 and a second shape S2 in which the second small opening 422_2 exposes the second small pixel opening 312_2 may be symmetrical to each other about the point of symmetry (P). Accordingly, even when the misalignment occurs when the lower structure 500 is coupled to the upper structure 600, a total area of light discharged to the outside of the display device 700 through the first small opening 422_1 and the second small opening 422_2 may be maintained constant.

Accordingly, the display device 700 according to the exemplary embodiments of the present inventive concept may reduce a defect rate for misalignment in the horizontal direction (for example, the first direction D1 or the second direction D2) and the vertical direction (for example, the third direction D3 or the fourth direction D4) when the upper structure 600 is coupled to the lower structure 500.

Figure 19:
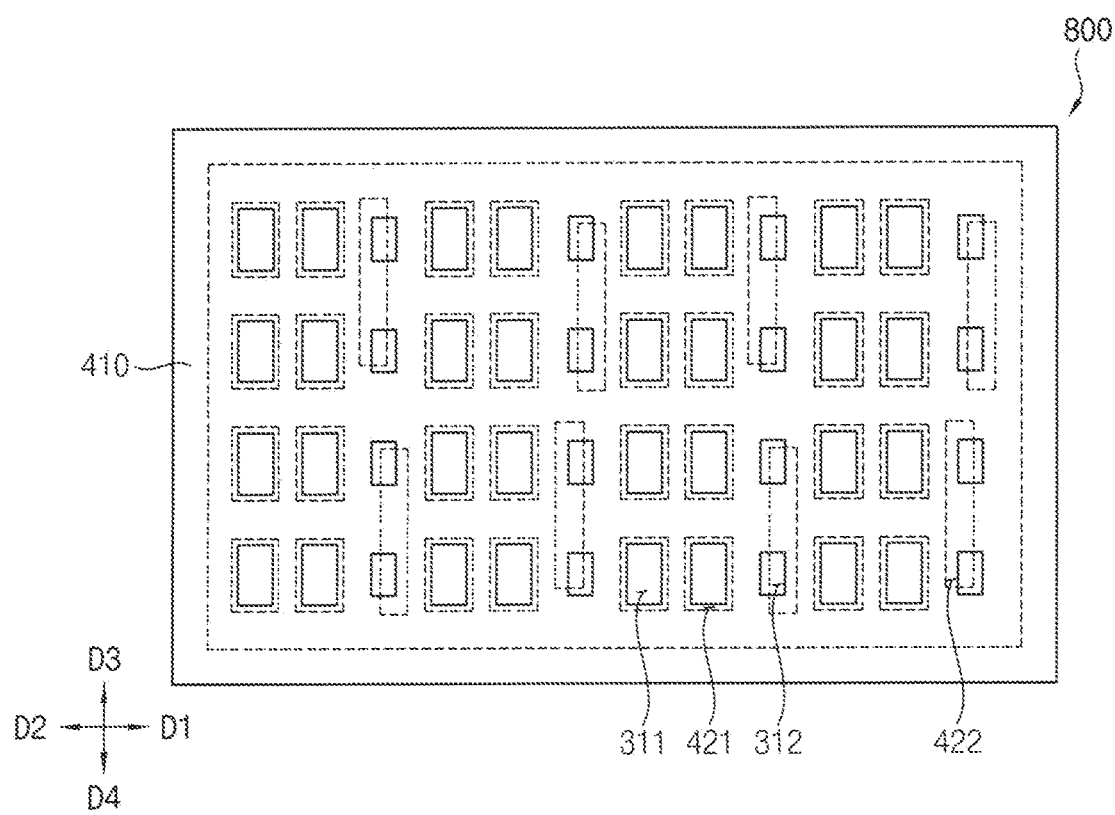
FIG. 19 is a plan view showing a display device according to exemplary embodiments of the present inventive concept.
Figure 20:
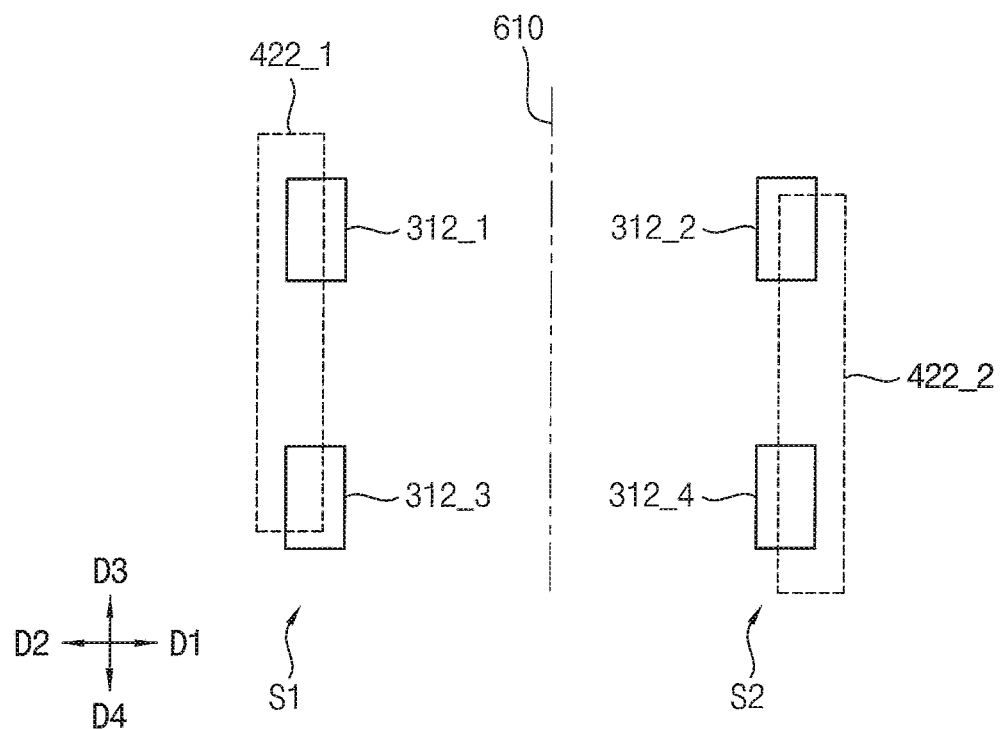
FIG. 20 is a plan view showing a shape in which openings of the pixel defining film overlap openings of the light blocking layer included in the display device of FIG. 19.

FIG. 19 is a plan view showing a display device according to exemplary embodiments of the present inventive concept. FIG. 20 is a plan view showing a shape in which openings of the pixel defining film overlap openings of the light blocking layer included in the display device of FIG. 19. The display device 800 illustrated in FIGS. 19 and 20 may have a configuration substantially the same as or similar to the display device 700 described with reference to FIGS. 16 to 18, except for the first shape S1 in which the first small opening 422_1 exposes the first small pixel opening 312_1 and the second shape S2 in which the second small opening 422_2 exposes the second small pixel opening 312_2. In FIGS. 19 and 20, duplicate descriptions for components substantially the same as or similar to the components described with reference to FIGS. 16 to 18 will be omitted.

Referring to FIGS. 19 and 20, the first small opening 422_1 partially exposes the first small pixel opening 312_1 and the third small pixel opening 3123 positioned while being spaced apart from the first small pixel opening 312_1 in the fourth direction D4. In addition, the second small opening 422_2 partially exposes the second small pixel opening 312_2 and the fourth small pixel opening 3124 positioned while being spaced apart from the second small pixel opening 312_2 in the fourth direction D4. In other words, one small opening 422 may partially expose two adjacent small pixel openings 312 along the third direction among the small pixel openings 312.

In exemplary embodiments, as shown in FIG. 20, when viewed in the direction perpendicular to the top surface of the upper substrate 410, a first shape S1 in which the first small pixel opening 312_1 and the third small pixel opening 312_3 is exposed by the first small opening 422_1, and a second shape S2 in which the second small pixel opening 312_2 and the fourth small pixel opening 312_4 is exposed by the second small opening 422_2 may be symmetrical to each other about a line of symmetry 610. The line of symmetry 610 may be positioned in a middle point between the first shape S1 and the second shape S2 and may extend in the third direction D3 (or the fourth direction D4).

Figure 21:
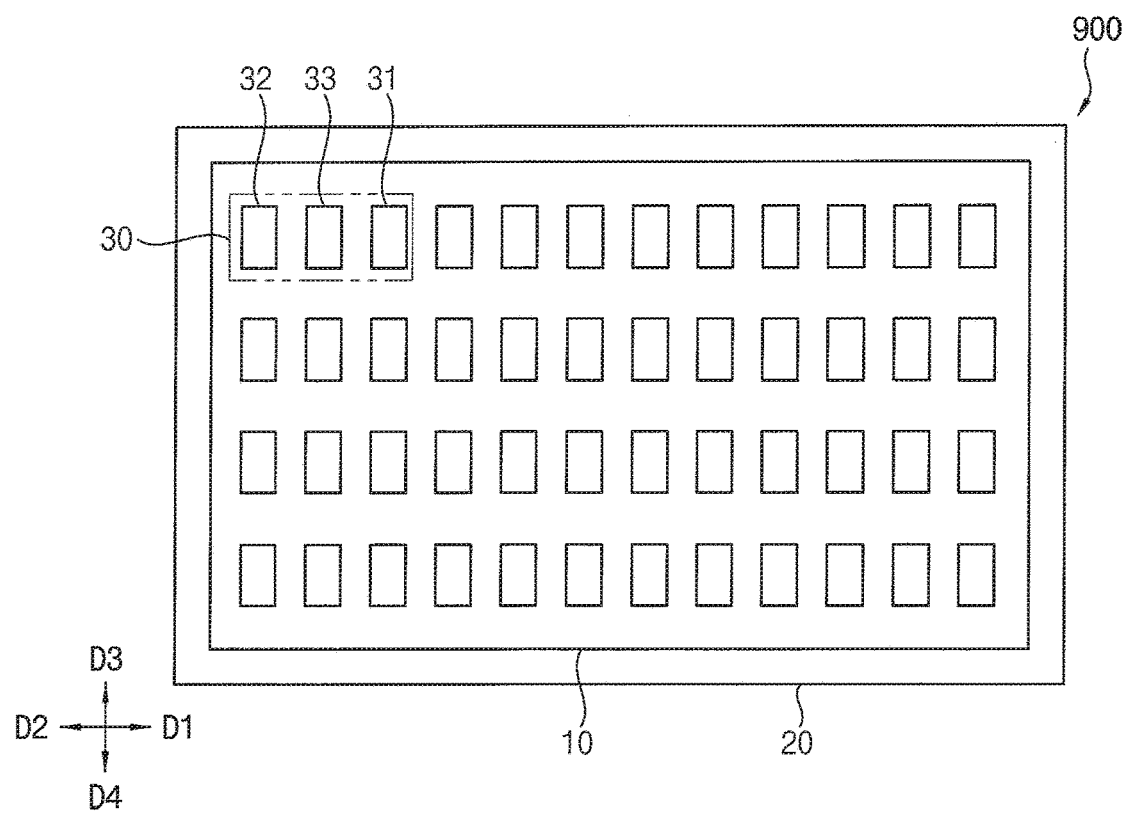
FIG. 21 is a plan view showing a display device according to exemplary embodiments of the present inventive concept.
Figure 22:
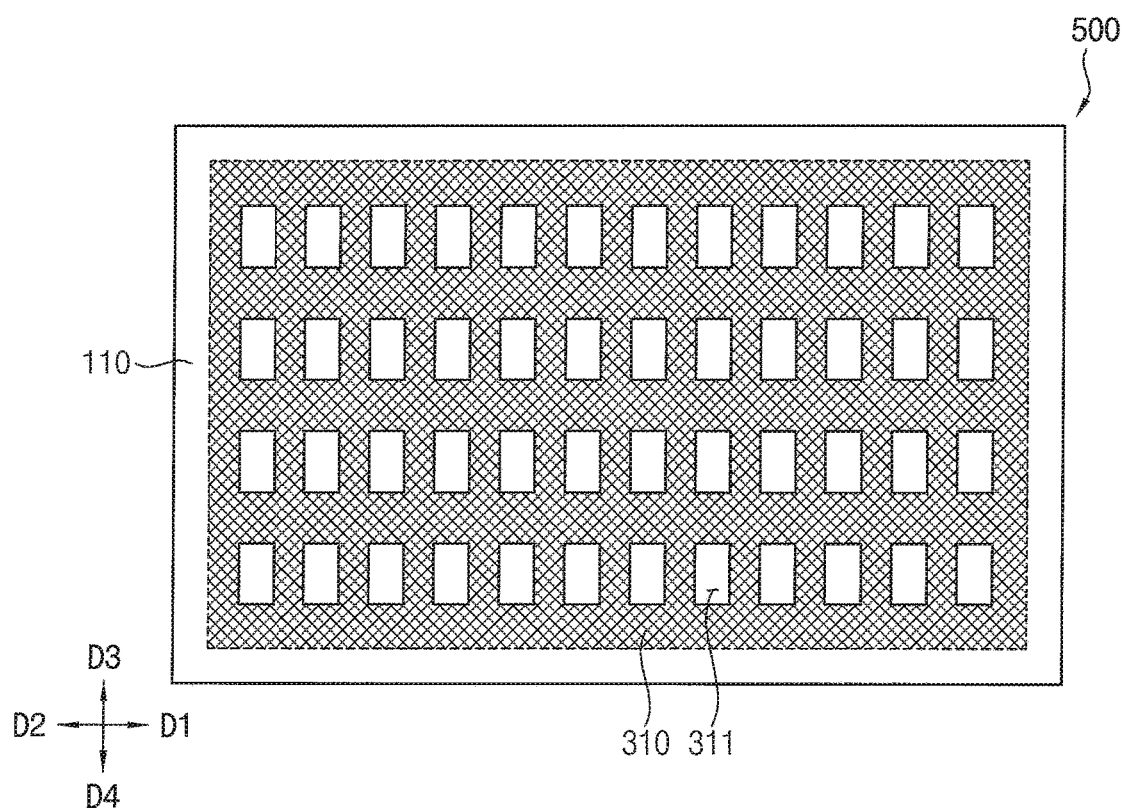
FIG. 22 is a plan view for explaining a pixel defining film included in the display device of FIG. 21.
Figure 23:
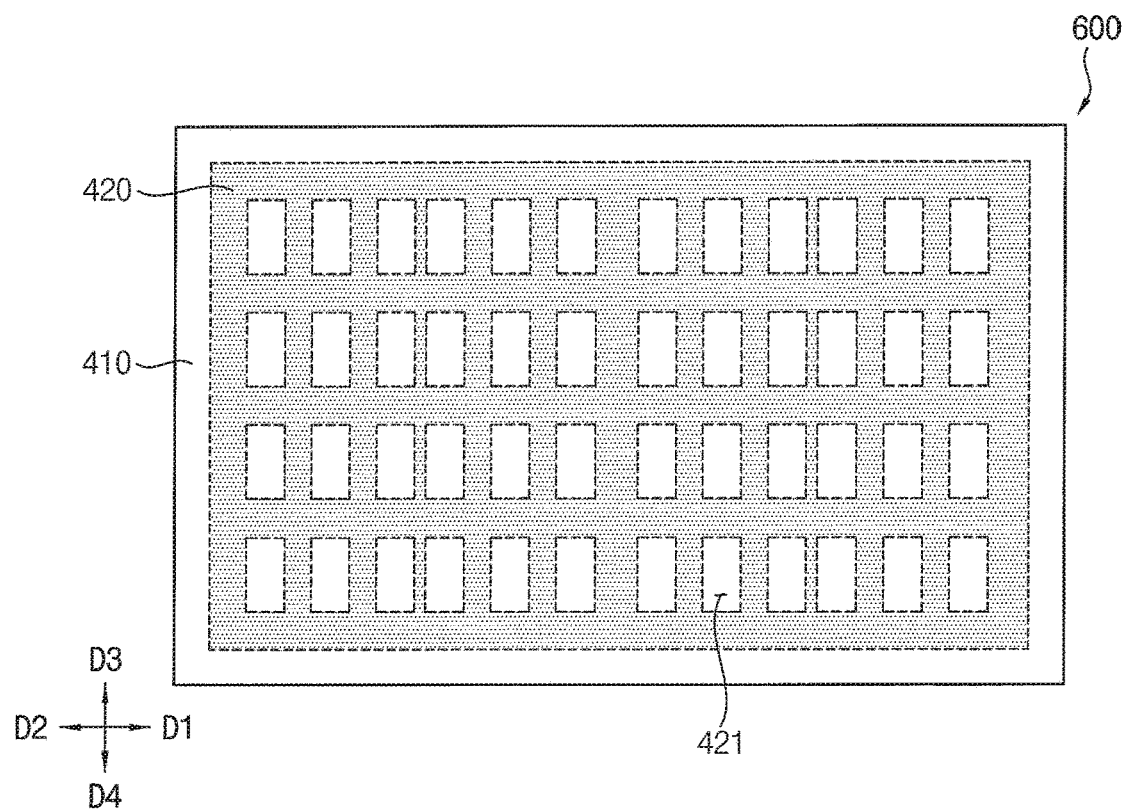
FIG. 23 is a plan view for explaining a light blocking layer included in the display device of FIG. 21.

FIG. 21 is a plan view showing a display device according to exemplary embodiments of the present inventive concept. FIG. 22 is a plan view for explaining a pixel defining film included in the display device of FIG. 21. FIG. 23 is a plan view for explaining a light blocking layer included in the display device of FIG. 21. The display device 900 illustrated in FIGS. 21 and 22 may have a configuration substantially the same as or similar to the display device 100 described with reference to FIGS. 1 to 4. In FIGS. 21 to 23, duplicate descriptions for components substantially the same as or similar to the components described with reference to FIGS. 1 to 4 will be omitted.

Referring to FIGS. 1, 21, 22, and 23, the display device 900 may include a lower structure 500 and an upper structure 600. The lower structure 500 and the upper structure 600 may be sealed and coupled by a sealant disposed at an outermost portion of the display panel 900. For example, the lower structure 500 and the upper structure 600 may be manufactured independently, and the upper structure 600 may be sealed and coupled by the sealant after disposed on the lower structure 500.

As shown in FIG. 21, the display device 900 may include a display area 10 and a peripheral area 20. The display area 10 may include a plurality of pixel areas 30. The pixel areas 30 may be arranged over a whole of the display area 10 in a matrix form. Each of the pixel area 30 may include a first sub-pixel area 31, a second sub-pixel area 32, and a third sub-pixel area 33.

In exemplary embodiments, the second sub-pixel area 32, the third sub-pixel area 33, and the first sub-pixel area 31 may be sequentially arranged in the first direction D1, and the first sub-pixel area region 31, the second sub-pixel area 32, and the third sub-pixel area 33 may have substantially the same size.

For example, pixel structures (such as semiconductor elements and light emitting structures) may be disposed in the display area 10, and the sealant, signal wirings, power wirings, and the like may be disposed in the peripheral area 20.

However, according to the present inventive concept, the second sub-pixel area 32, the third sub-pixel area 33, and the first sub-pixel area 31 included in each of the pixel areas 30 have been described as being arranged in the first direction D1, however, the configuration of the present inventive concept is not limited thereto. For example, the first sub-pixel area 31 may be disposed while being spaced apart from the second sub-pixel area 32 in the second direction D2. In contrast, the first sub-pixel area 31 may be disposed while being spaced apart from the second sub-pixel area 32 and the third sub-pixel area 33 in the third direction D3 or in the fourth direction D4 opposite to the third direction D3.

In addition, although the pixel area 30 of the present inventive concept has been described as including three sub-pixel areas 31, 32 and 33, the configuration of the present inventive concept is not limited thereto. For example, the pixel area 30 may include two sub-pixel areas or at least four sub-pixel areas.

Further, although each of the display area 10, the peripheral area 20, the pixel area 30, the first sub-pixel area 31, the second sub-pixel area 32, and the third sub-pixel area 33 of the present inventive concept has been described as having a rectangular plane shape, the configuration of the present inventive concept is not limited thereto. For example, the above shape may have a triangular plane shape, a rhombic plane shape, a polygonal plane shape, a circular plane shape, a track plane shape, or an oval plane shape.

As shown in FIG. 22, the lower structure 500 may include a lower substrate 110, a pixel defining film 310, and the like. The pixel defining film 310 may be disposed on the lower substrate 110. The pixel defining layer 310 may include pixel openings 311. For example, the pixel openings 311 may be disposed to areas corresponding to each of the first sub-pixel area 31, the second sub-pixel area 32, and the third sub-pixel area 33. In other words, each size of the pixel openings 311 may be substantially the same as each size of the first sub-pixel area 31, the second sub-pixel area 32 and the third sub-pixel area 33.

As shown in FIG. 23, the upper structure 600 may include an upper substrate 410, a light blocking layer 420, and the like. The light blocking layer 420 may be disposed on a bottom surface of the upper substrate 410. In exemplary embodiments, the light blocking layer 420 may include openings 421. For example, the openings 421 may be disposed to areas corresponding to the pixel openings 311, respectively. In addition, each size of the openings 421 may be larger than each size of the pixel openings 311.

For example, the light emitting layer may be disposed in the pixel openings 311 of the pixel defining layer 310 and light emitted from the light emitting layer may be discharged to the outside through the openings 421 of the light blocking layer 420.

Figure 24:
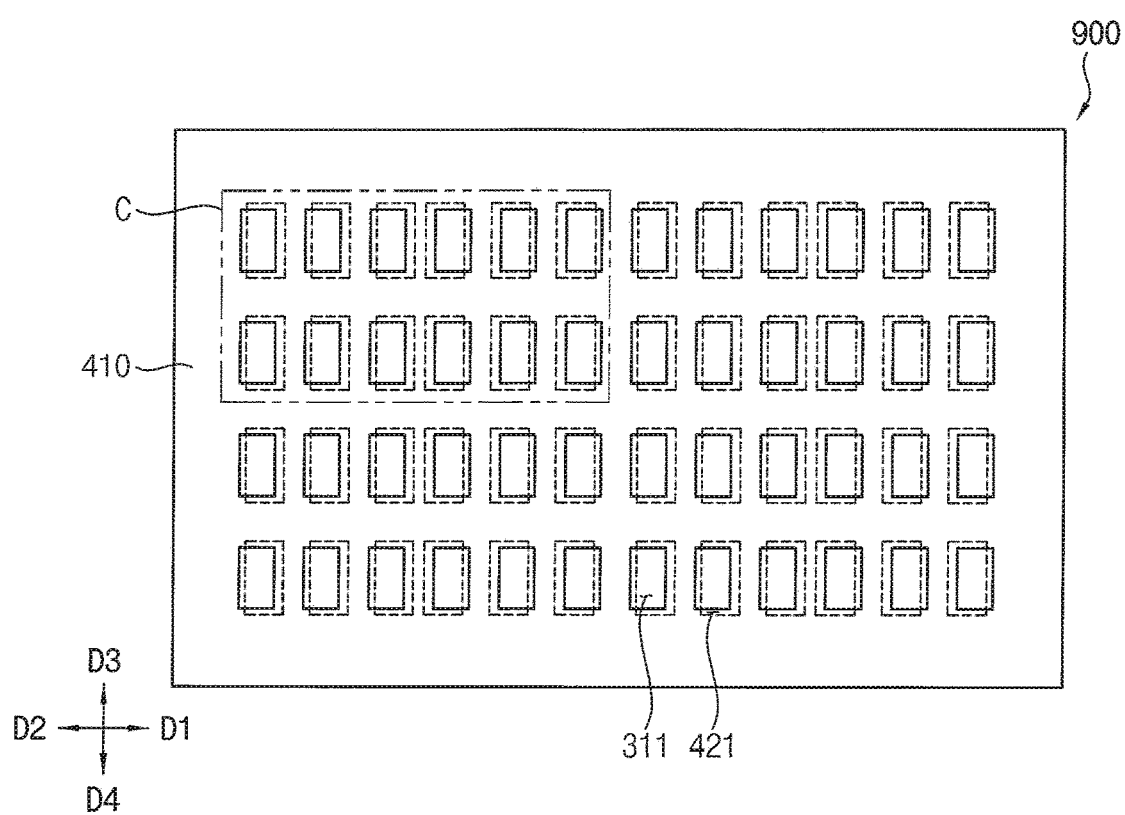
FIG. 24 is a plan view showing a shape in which the lower structure 500 and the upper structure 600 are overlapped each other.
Figure 25:
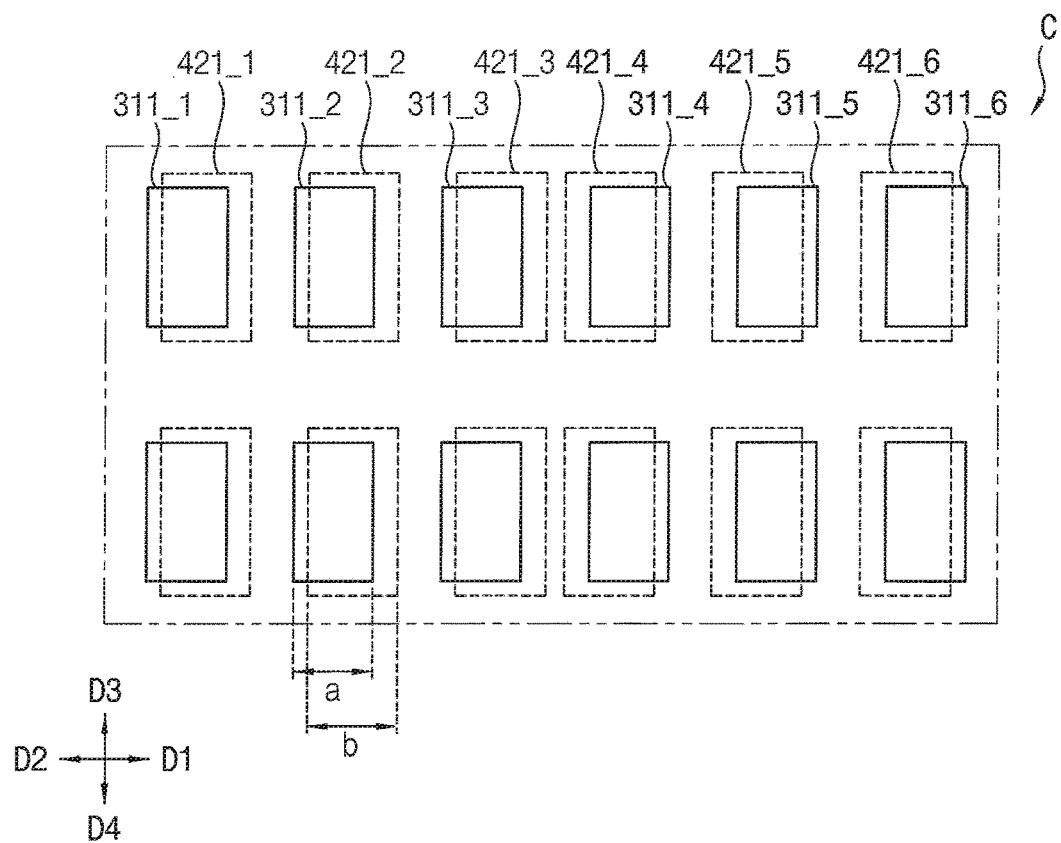
FIG. 25 is an enlarged plan view showing the area 'C' of FIG. 21.
Figure 26:
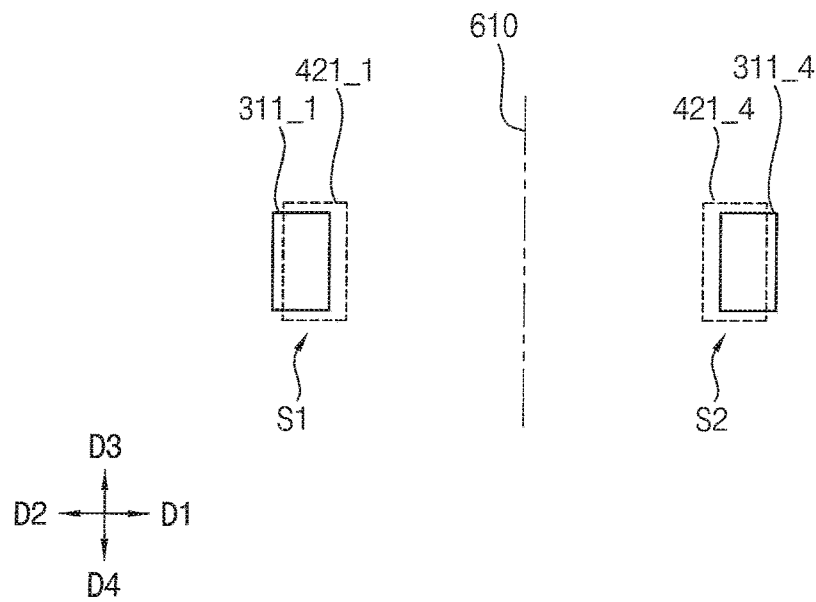
FIGS. 26, 27 and 28 are plan views for explaining a shape of the openings of the pixel defining film and the openings of the light blocking layer of FIG. 21.
Figure 27:
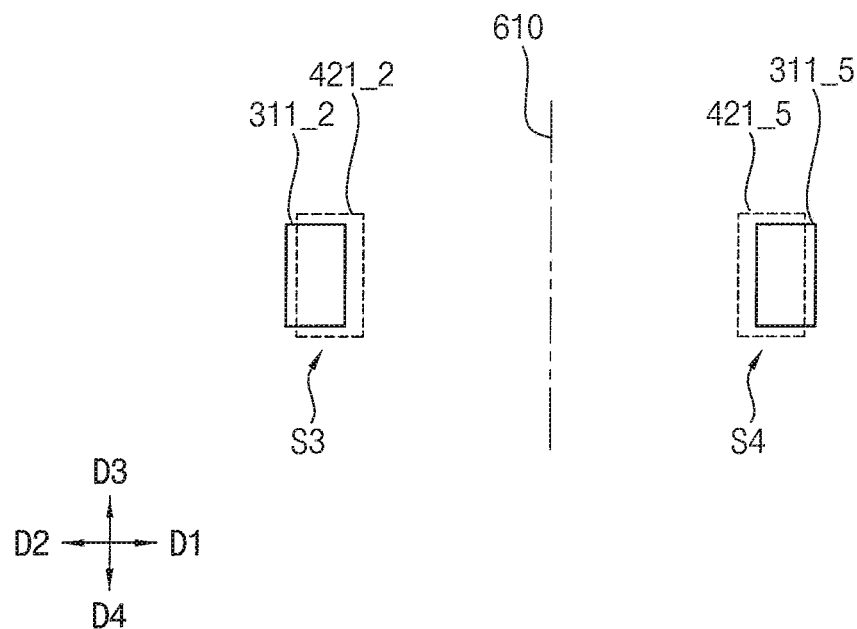
Figure 28:
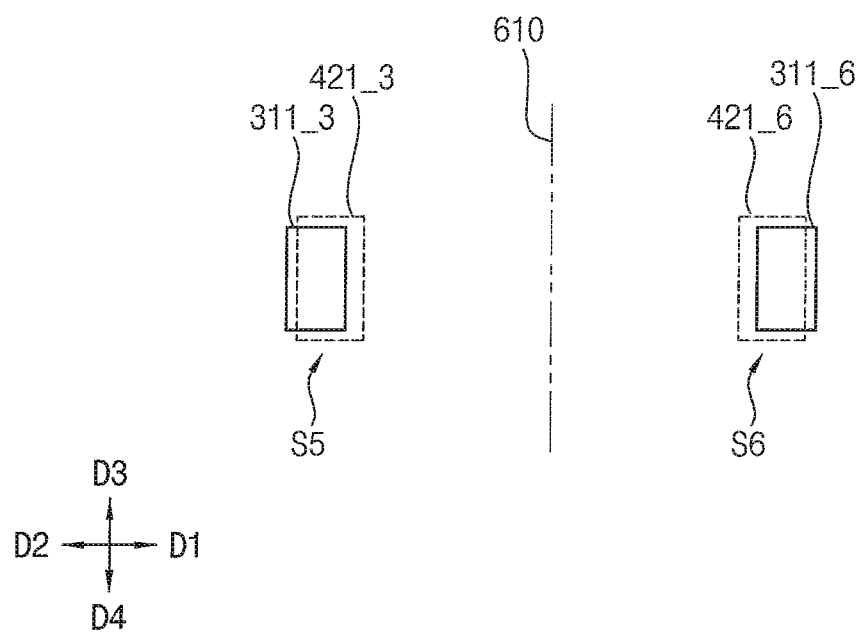

FIG. 24 is a plan view showing a shape in which the lower structure 500 and the upper structure 600 are overlapped each other. FIG. 25 is an enlarged plan view showing the area 'C' of FIG. 21. FIGS. 26 to 28 are plan views for explaining a shape of the openings of the pixel defining film and the openings of the light blocking layer of FIG. 21. The display device 900 illustrated in FIGS. 24, 25, 26, 27, and 28 may have a configuration substantially the same as or similar to the display device 100 described with reference to FIGS. 5 to 7. In FIGS. 24 to 28, duplicate descriptions for components substantially the same as or similar to the components described with reference to FIGS. 5 to 7 will be omitted.

Referring to FIGS. 24, 25, 26, 27, and 28, when viewed in the direction perpendicular to the top surface of the upper substrate 410, the pixel openings 311 are not fully exposed by the openings 421. In other words, the openings 421 may partially expose the pixel openings 311, respectively. In exemplary embodiments, some of the openings 421 may be shifted in the first direction D1 on the pixel openings 311 so as not to expose left sides of the pixel openings 311, respectively, and the remaining of the openings 421 may be shifted in the second direction D2 on the pixel openings 311 so as not to expose right sides of the pixel openings 311, respectively.

For example, as shown in FIG. 25, the pixel openings 311 may include a first pixel opening 311_1, a second pixel opening 311_2, a third pixel opening 311_3, a fourth pixel opening 311_4, a fifth pixel opening 3115, and a sixth pixel opening 311_6. In addition, the openings 421 may include a first opening 421_1, a second opening 421_2, a third opening 421_3, a fourth opening 421_4, a fifth opening 421_5, and a sixth opening 421_6.

The first pixel opening 311_1, the second pixel opening 311_2, and the third pixel opening 311_3 may correspond to a first pixel area, and the fourth pixel opening 311_4, the fifth pixel opening 3115, and the sixth pixel opening 3116 may correspond to a second pixel area positioned adjacent to the first pixel area.

In exemplary embodiments, light emitted from a light emitting layer disposed on the first pixel opening 311_1 and light emitted from a light emitting layer disposed on the fourth pixel opening 311_4 may have the same color, or a color in which the light emitted from the light emitting layer disposed on the first pixel opening 311_1 is discharged to the outside of the display device 900 through the first opening 421_1 may be the same as a color in which the light emitted from the light emitting layer disposed on the fourth pixel opening 311_4 is discharged to the outside of the display device 900 through the fourth opening 421_4.

In addition, light emitted from a light emitting layer disposed on the second pixel opening 311_2 and light emitted from a light emitting layer disposed on the fifth pixel opening 3115 may have the same color, or a color in which the light emitted from the light emitting layer disposed on the second pixel opening 311_2 is discharged to the outside of the display device 900 through the second opening 421_2 may be the same as a color in which the light emitted from the light emitting layer disposed on the fifth pixel opening 311_5 is discharged to the outside of the display device 900 through the fifth opening 4215.

Further, light emitted from a light emitting layer disposed on the third pixel opening 311_3 and light emitted from a light emitting layer disposed on the sixth pixel opening 3116 may have the same color, or a color in which the light emitted from the light emitting layer disposed on the third pixel opening 311_3 is discharged to the outside of the display device 900 through the third opening 421_3 may be the same as a color in which the light emitted from the light emitting layer disposed on the sixth pixel opening 3116 is discharged to the outside of the display device 900 through the sixth opening 4216.

Each of the first pixel opening 311_1, the second pixel opening 311_2, the third pixel opening 311_3, the fourth pixel opening 311_4, the fifth pixel opening 3115, and the sixth pixel opening 3116 may have a first width a, and each of the first opening 421_1, the second opening 421_2, the third opening 421_3, the fourth opening 421_4, the fifth opening 421_5, and the sixth opening 4216 may have a second width b. The first width a may be smaller than the second width b. In other words, the first opening 421_1, the second opening 421_2, the third opening 421_3, the fourth opening 421_4, the fifth opening 4215, and the sixth opening 421_6 may be larger than the first pixel opening 311_1, the second pixel opening 311_2, the third pixel opening 311_3, the fourth pixel opening 311_4, the fifth pixel opening 3115, and the sixth pixel opening 3116, respectively.

The first opening 421_1, the second opening 421_2, the third opening 421_3, the fourth opening 421_4, the fifth opening 4215, and the sixth opening 4216 may partially expose the first pixel opening 311_1, the second pixel opening 311_2, the third pixel opening 311_3, the fourth pixel opening 311_4, the fifth pixel opening 3115, and the sixth pixel opening 3116, respectively. In other words, the first pixel opening 311_1, the second pixel opening 311_2, the third pixel opening 311_3, the fourth pixel opening 311_4, the fifth pixel opening 3115, and the sixth pixel opening 3116 may be partially covered by the light blocking layer 420.

In exemplary embodiments, the fourth pixel opening 311_4 may be spaced apart from the first pixel opening 311_1 in the first direction D1, the fifth pixel opening 311_5 may be spaced apart from the second pixel opening 311_2 in the first direction D1, and the sixth pixel opening 311_6 may be spaced apart from the third pixel opening 311_3 in the first direction D1.

A right side of each of the first pixel opening 311_1, the second pixel opening 311_2, the third pixel opening 311_3, the fourth pixel opening 311_4, the fifth pixel opening 311_5, and the sixth pixel opening 3116 are defined as a first portion, and a left side thereof are defined as a second portion.

The first opening 421_1 may be shifted in the first direction D1 on the first pixel opening 311_1 so as not to expose the second portion of the first pixel opening 311_1, and the fourth opening 421_4 may be shifted in the second direction D2 on the fourth pixel opening 311_4 so as not to expose the first portion of the fourth pixel opening 311_4. As shown in FIG. 26, when viewed in the direction perpendicular to the top surface of the upper substrate 410, a first shape S1 in which the first pixel opening 311_1 is exposed by the first opening 421_1 and a second shape S2 in which the fourth pixel opening 311_4 is exposed by the fourth opening 421_4 may be symmetrical to each other about a line of symmetry 610. The line of symmetry 610 may be positioned in a middle point between the first shape S1 and the second shape S2 and extend in the third direction D3 (or the fourth direction D4).

Referring back to FIG. 25, the second opening 421_2 may be shifted in the first direction D1 on the second pixel opening 311_2 so as not to expose the second portion of the second pixel opening 311_2, and the fifth opening 421_5 may be shifted in the second direction D2 on the fifth pixel opening 3115 so as not to expose the first portion of the fifth pixel opening 311_5. As shown in FIG. 27, when viewed in the direction perpendicular to the top surface of the upper substrate 410, a third shape S3 in which the second pixel opening 311_2 is exposed by the second opening 421_2, and a fourth shape S4 in which the fifth pixel opening 3115 is exposed by the fifth opening 4215 may be symmetrical to each other about a line of symmetry 610. The line of symmetry 610 may be positioned in a middle point between the third shape S3 and the fourth shape S4 and may extend in the third direction D3 (or the fourth direction D4).

Referring back to FIG. 25, the third opening 421_3 may be shifted in the first direction D1 on the third pixel opening 311_3 so as not to expose the second portion of the third pixel opening 311_3, and the sixth opening 421_6 may be shifted in the second direction D2 on the sixth pixel opening 3116 so as not to expose the first portion of the sixth pixel opening 311_6. As shown in FIG. 28, when viewed in the direction perpendicular to the top surface of the upper substrate 410, a fifth shape S5 in which the third pixel opening 311_3 is exposed by the third opening 421_3, and a sixth shape S6 in which the sixth pixel opening 311_6 is exposed by the sixth opening 4216 may be symmetrical to each other about a line of symmetry 610. The line of symmetry 610 may be positioned in a middle point between the fifth shape S5 and the sixth shape S6 and may extend in the third direction D3 (or the fourth direction D4).

In exemplary embodiments, the display device 900 may include the first opening 421_1, the second opening 421_2, the third opening 421_3, the fourth opening 421_4, the fifth opening 4215, and the sixth opening 421_6 that overlap the first pixel opening 311_1, the second pixel opening 311_2, the third pixel opening 311_3, the fourth pixel opening 311_4, the fifth pixel opening 3115, and the sixth pixel opening 3116, respectively. In addition, when viewed in the direction perpendicular to the top surface of the upper substrate 410, a first shape S1 in which the first pixel opening 311_1 is exposed by the first opening 421_1, and a second shape S2 in which the fourth pixel opening 311_4 is exposed by the fourth opening 421_4 may be symmetrical to each other about the line of symmetry 610; a third shape S3 in which the second pixel opening 311_2 is exposed by the second opening 421_2, and a fourth shape S4 in which the fifth pixel opening 311_5 is exposed by the fifth opening 4215 may be symmetrical to each other about the line of symmetry 610; and a fifth shape S5 in which the third pixel opening 311_3 is exposed by the third opening 421_3, and a sixth shape S6 in which the sixth pixel opening 3116 is exposed by the sixth opening 4216 may be symmetrical to each other about a line of symmetry 610. Accordingly, even when the misalignment occurs upon coupling the lower structure 500 to the upper structure 600, a total area of light emitted to the outside through the first opening 421_1 and the fourth opening 421_4, a total area of light emitted to the outside through the second 421_2 and the fifth opening 4215, and a total area of light emitted to the outside through the third opening 421_3 and the sixth opening 4216 may be maintained constant, respectively.

Figure 29:
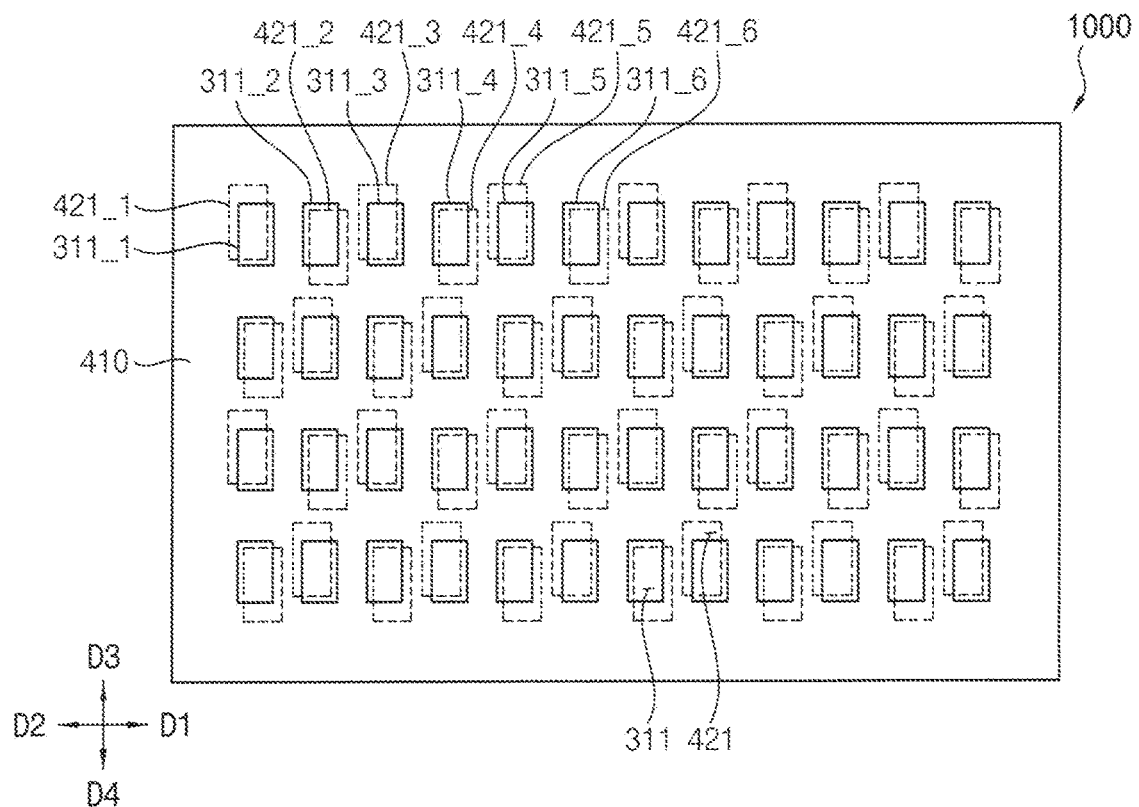
FIG. 29 is a plan view showing the display device according to exemplary embodiments of the present inventive concept.

FIG. 29 is a plan view showing the display device according to exemplary embodiments of the present inventive concept. The display device 1000 illustrated in FIG. 29 may have a configuration substantially the same as or similar to the display device 900 described with reference to FIGS. 21 to 28, except for a first shape S1 in which the first pixel opening 311_1 is exposed by the first opening 421_1, a second shape S2 in which the fourth pixel opening 311_4 is exposed by the fourth opening 421_4, a third shape S3 in which the second pixel opening 311_2 is exposed by the second opening 421_2, a fourth shape S4 in which the fifth pixel opening 3115 is exposed by the fifth opening 4215, a fifth shape S5 in which the third pixel opening 311_3 is exposed by the third opening 421_3, and a sixth shape S6 in which the sixth pixel opening 311_6 is exposed by the sixth opening 421_6. In FIG. 29, duplicate descriptions for components substantially the same as or similar to the components described with reference to FIGS. 21 to 28 will be omitted.

Referring to FIGS. 25 and 29, when viewed in the direction perpendicular to the top surface of the upper substrate 410, the openings 421 may be disposed to partially expose the pixel openings 311. For example, the light blocking layer which includes the openings 421 may partially cover the pixel openings 311, respectively. In exemplary embodiments, some of the openings 421 may be shifted in the second direction D2 and the third direction D3 on the pixel openings 311 so as not to expose the first portion (a right portion and a bottom portion) of the pixel openings 311, respectively, and the remaining of the openings 421 may be shifted in the first direction D1 and the fourth direction D4 on the pixel openings 311 so as not to expose the second portion (a left portion and a top portion) of the pixel openings 311, respectively.

For example, the pixel openings 311 may include a first pixel opening 311_1, a second pixel opening 311_2, a third pixel opening 311_3, a fourth pixel opening 311_4, a fifth pixel opening 311_5, and a sixth pixel opening 311_6. In addition, the openings 421 may include the first opening 421_1, the second opening 421_2, the third opening 421_3, the fourth opening 421_4, the fifth opening 421_5, and the sixth opening 421_6.

The first pixel opening 311_1, the second pixel opening 311_2, and the third pixel opening 311_3 may be disposed in areas corresponding to a first pixel area, and the fourth pixel opening 311_4, the fifth pixel opening 3115, and the sixth pixel opening 3116 may be disposed in areas corresponding to a second pixel area positioned adjacent to the first pixel area.

In exemplary embodiments, light emitted from a light emitting layer disposed on the first pixel opening 311_1 and light emitted from a light emitting layer disposed on the fourth pixel opening 311_4 have the same color, or a color in which the light emitted from the light emitting layer disposed on the first pixel opening 311_1 is emitted to the outside of the display device 1000 through the first opening 421_1 may be the same as a color in which the light emitted from the light emitting layer disposed on the fourth pixel opening 311_4 is emitted to the outside of the display device 1000 through the fourth opening 421_4.

In addition, light emitted from a light emitting layer disposed on the second pixel opening 311_2 and light emitted from a light emitting layer disposed on the fifth pixel opening 3115 have the same color, or a color in which the light emitted from the light emitting layer disposed on the second pixel opening 311_2 is emitted to the outside of the display device 1000 through the second opening 421_2 may be the same as a color in which the light emitted from the light emitting layer disposed on the fifth pixel opening 311_5 is emitted to the outside of the display device 1000 through the fifth opening 421_5.

Further, light emitted from a light emitting layer disposed on the third pixel opening 311_3 and light emitted from a light emitting layer disposed on the sixth pixel opening 3116 have the same color, or a color in which the light emitted from the light emitting layer disposed on the third pixel opening 311_3 is emitted to the outside of the display device 1000 through the third opening 421_3 may be the same as a color in which the light emitted from the light emitting layer disposed on the sixth pixel opening 3116 is emitted to the outside of the display device 1000 through the sixth opening 4216.

Each of the first pixel opening 311_1, the second pixel opening 311_2, the third pixel opening 311_3, the fourth pixel opening 311_4, the fifth pixel opening 3115, and the sixth pixel opening 3116 may have a first width a, and each of the first opening 421_1, the second opening 421_2, the third opening 421_3, the fourth opening 421_4, the fifth opening 421_5, and the sixth opening 4216 may have a second width b. The width a may be smaller than the second width b. In other words, the first opening 421_1, the second opening 421_2, the third opening 421_3, the fourth opening 421_4, the fifth opening 4215, and the sixth opening 4216 may be larger than the first pixel opening 311_1, the second pixel opening 311_2, the third pixel opening 311_3, the fourth pixel opening 311_4, the fifth pixel opening 311_5, and the sixth pixel opening 311_6, respectively.

The first opening 421_1, the second opening 421_2, the third opening 421_3, the fourth opening 421_4, the fifth opening 4215, and the sixth opening 4216 may partially expose the first pixel opening 311_1, the second pixel opening 311_2, the third pixel opening 311_3, the fourth pixel opening 311_4, the fifth pixel opening 3115, and the sixth pixel opening 3116, respectively. In other words, the first pixel opening 311_1, the second pixel opening 311_2, the third pixel opening 311_3, the fourth pixel opening 311_4, the fifth pixel opening 3115, and the sixth pixel opening 3116 may be partially covered by the light blocking layer 420.

In exemplary embodiments, the fourth pixel opening 311_4 may be spaced apart from the first pixel opening 311_1 in the first direction D1, the fifth pixel opening 311_5 may be spaced apart from the second pixel opening 311_2 in the first direction D1, and the sixth pixel opening 311_6 may be spaced apart from the third pixel opening 311_3 in the first direction D1.

A right side and a lower portion of each of the first pixel opening 311_1, the second pixel opening 311_2, the third pixel opening 311_3, the fourth pixel opening 311_4, the fifth pixel opening 3115, and the sixth pixel opening 311_6 are defined as a first portion, and a left side and an upper portion thereof are defined as a second portion.

The first opening 421_1 may be shifted in the second direction D2 and the third direction D3 on the first pixel opening 311_1 so as not to expose the second portion of the first pixel opening 311_1, and the fourth opening 421_4 may be shifted in the first direction D1 and the fourth direction D4 on the fourth pixel opening 311_4 so as not to expose the first portion of the fourth pixel opening 311_4. When viewed in the direction perpendicular to the top surface of the upper substrate 410, a first shape in which the first pixel opening 311_1 overlaps the first opening 421_1 and a second shape in which the fourth pixel opening 311_4 overlaps the fourth opening 421_4 may be symmetrical to each other about a point of symmetry.

The second opening 421_2 may be shifted in the first direction D1 and the fourth direction D4 on the second pixel opening 311_2 so as not to expose the second portion of the second pixel opening 311_2, and the fifth opening 421_5 may be shifted in the second direction D2 and the third direction D3 on the fifth pixel opening 3115 so as not to expose the first portion of the fifth pixel opening 311_5. When viewed in the direction perpendicular to the top surface of the upper substrate 410, a first shape in which the second pixel opening 311_2 overlaps the second opening 421_2 and a fourth shape in which the fifth pixel opening 311_5 overlaps the fifth opening 421_5 may be symmetrical to each other about a point of symmetry.

The third opening 421_3 may be shifted in the second direction D2 and the third direction D3 on the third pixel opening 311_3 so as not to expose the first portion of the third pixel opening 311_3, and the sixth opening 4216 may be shifted in the first direction D1 and the fourth direction D4 on the sixth pixel opening 311_6 so as not to overlap the second portion of the sixth pixel opening 311_6. When viewed in the direction perpendicular to the top surface of the upper substrate 410, a fifth shape in which the third pixel opening 311_3 overlaps the third opening 421_3 and a sixth shape in which the sixth pixel opening 3116 overlaps the sixth opening 4216 may be symmetrical to each other about a point of symmetry.

Accordingly, the display device 1000 according to the exemplary embodiments of the present inventive concept may reduce a defect rate for misalignment in the horizontal direction (for example, the first direction D1 or the second direction D2) and the vertical direction (for example, the third direction D3 or the fourth direction D4) when the upper structure 600 is coupled to the lower structure 500.

Figure 30:
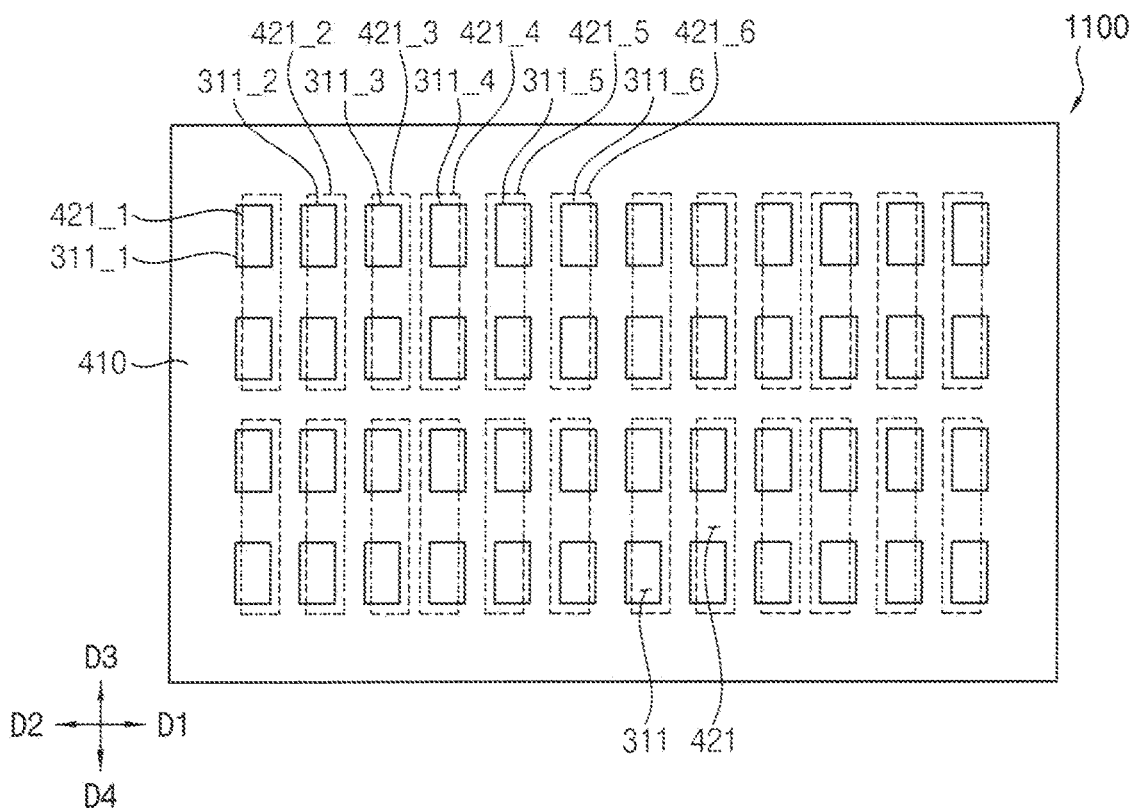
FIG. 30 is a plan view showing the display device according to exemplary embodiments of the present inventive concept.

FIG. 30 is a plan view showing the display device according to exemplary embodiments of the present inventive concept. The display device 1100 illustrated in FIG. 30 may have a configuration substantially the same as or similar to the display device 900 described with reference to FIGS. 21 to 28. In FIG. 30, duplicate descriptions for components substantially the same as or similar to the components described with reference to FIGS. 21 to 28 will be omitted.

Referring to FIGS. 25 and 30, the first opening 421_1 may partially expose the first pixel opening 311_1 and a seventh pixel opening positioned while being spaced apart from the first pixel opening 311_1 in the fourth direction D4. The second opening 421_2 may partially expose the second pixel opening 311_2 and an eighth pixel opening positioned while being spaced apart from the second pixel opening 311_2 in the fourth direction D4. The third opening 421_3 may partially expose the third pixel opening 311_3 and a ninth pixel opening positioned while being spaced apart from the third pixel opening 311_3 in the fourth direction D4. The fourth opening 421_4 may partially expose the fourth pixel opening 311_4 and a tenth pixel opening positioned while being spaced apart from the fourth pixel opening 311_4 in the fourth direction D4. The fifth opening 4215 may partially expose the fifth pixel opening 3115 and an eleventh pixel opening positioned while being spaced apart from the fifth pixel opening 3115 in the fourth direction D4. The sixth opening 4216 may partially expose the sixth pixel opening 311_6 and a twelfth pixel opening positioned while being spaced apart from the sixth pixel opening 311_6 in the fourth direction D4.

In exemplary embodiments, when viewed in the direction perpendicular to the top surface of the upper substrate 410, a first shape in which the first pixel opening 311_1 and the seventh pixel opening are exposed by the first opening 421_1, and a second shape in which the fourth pixel opening 311_4 and the tenth pixel opening are exposed by the fourth opening 421_4 may be symmetrical to each other about a line of symmetry. In addition, when viewed in the direction perpendicular to the top surface of the upper substrate 410, a third shape in which the second pixel opening 311_2 and the eighth pixel opening are exposed by the second opening 421_2, and a fourth shape in which the fifth pixel opening 3115 and the eleventh pixel opening are exposed by the fifth opening 4215 may be symmetrical to each other about a line of symmetry. Further, when viewed in the direction perpendicular to the top surface of the upper substrate 410, a fifth shape in which the third pixel opening 311_3 and the ninth pixel opening are exposed by the third opening 421_3, and a sixth shape in which the sixth pixel opening 311_6 and the twelfth pixel opening are exposed by the sixth opening 421_6 may be symmetrical to each other about a line of symmetry.

The present inventive concept may be applied to various electronic devices including a display device. For example, the present inventive concept may be applied to numerous electronic devices such as a vehicle-display device, a ship-display device, an aircraft-display device, portable communication devices, display devices for display or for information transfer, a medical-display device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A display device comprising:
   a lower substrate;
   a pixel defining layer disposed on the lower substrate and including a first opening and a second opening spaced apart from the first opening in a first direction, each of the first opening and the second opening exposing a pixel electrode in a pixel which displays a same color;
   a light emitting layer disposed in each of the first opening and the second opening;
   an upper substrate disposed on the light emitting layer;
   a first color filter including a first surface contacting the upper substrate and a second surface opposite to the first surface in a vertical direction perpendicular to the upper substrate; and
   a light blocking layer disposed on the first color filter and including a third opening partially exposing the first opening and a fourth opening partially exposing the second opening, the light blocking layer partially covering each of the first opening and the second opening in a plan view,
   wherein the first color filter is disposed between the upper substrate and the light blocking layer along the vertical direction perpendicular to the upper substrate,
   wherein the third opening exposes a right edge of the first opening and does not expose a left edge of the first opening in the first direction, and the fourth opening exposes a left edge of the second opening and does not expose a right edge of the second opening in the first direction in a plan view, and
   wherein an entirety of a top surface of the light blocking layer directly contacts the second surface of the first color filter.

2. The display device of claim 1, wherein the first color filter is disposed in each of the third opening and the fourth opening of the light blocking layer, and
   wherein the first color filter transmits a first color of light.

3. The display device of claim 1, wherein the light blocking layer covers the left edge of the first opening and the right edge of the second opening.

4. The display device of claim 1, wherein the pixel defining layer further includes:
   a fifth opening disposed between the first opening and the second opening, and
   a sixth opening spaced apart from the second opening in the first direction, and
   wherein the light blocking layer further includes:
   a seventh opening completely exposing the fifth opening and larger than the fifth opening, and
   an eighth opening completely exposing the sixth opening and larger than the sixth opening.

5. The display device of claim 1, wherein the pixel defining layer further includes:
   a fifth opening disposed between the first opening and the second opening, and
   a sixth opening spaced apart from the second opening in the first direction, and
   wherein the light blocking layer further includes:
   a seventh opening partially exposing the fifth opening, and
   an eighth opening partially exposing the sixth opening.

6. The display device of claim 5, wherein a third overlapped configuration of the fifth opening and the seventh opening and a fourth overlapped configuration of the sixth opening and the eighth opening are symmetrical to each other about the line of symmetry in a plan view.

7. The display device of claim 6, wherein a first overlapped configuration of the first opening and the third opening is identical to the third overlapped configuration and a second overlapped configuration of the second opening and the fourth opening is identical to the fourth overlapped configuration.

8. A display device comprising:
   a lower substrate;
   a pixel defining layer disposed on the lower substrate and including a first opening and a second opening spaced apart from the first opening in a first direction, each of the first opening and the second opening exposing a pixel electrode in a pixel which displays a same color;
   a light emitting layer disposed in each of the first opening and the second opening;
   an upper substrate disposed on the light emitting layer;
   a first color filter including a first surface contacting the upper substrate and a second surface opposite to the first surface in a vertical direction perpendicular to the upper substrate; and
   a light blocking layer disposed on the first color filter and including a third opening partially exposing the first opening and a fourth opening partially exposing the second opening, the light blocking layer partially covering each of the first opening and the second opening in a plan view, wherein the first color filter is disposed between the upper substrate and the light blocking layer along the vertical direction perpendicular to the upper substrate, wherein the third opening exposes a left edge of the first opening and does not expose a right edge of the first opening in the first direction, and the fourth opening exposes a right edge of the second opening and does not expose a left edge of the second opening in the first direction, and wherein an entirety of a top surface of the light blocking layer directly contacts the second surface of the first color filter.

9. The display device of claim 8, wherein the first color filter is disposed in each of the third opening and the fourth opening of the light blocking layer, and wherein the first color filter transmits a first color of light.

10. The display device of claim 8, wherein the light blocking layer covers a bottom edge and the right side of the first opening, and a top edge and the left edge of the second opening.

11. The display device of claim 8, wherein the pixel defining layer further includes:

a fifth opening disposed between the first opening and the second opening, and a sixth opening spaced apart from the second opening in the first direction, and wherein the light blocking layer further includes:

a seventh opening completely exposing the fifth opening and larger than the fifth opening, and an eighth opening completely exposing the sixth opening and larger than the sixth opening.

12. The display device of claim 8, wherein the pixel defining layer further includes:

a fifth opening disposed between the first opening and the second opening, and a sixth opening spaced apart from the second opening in the first direction, and wherein the light blocking layer further includes:

a seventh opening partially exposing the fifth opening, and an eighth opening partially exposing the sixth opening.

13. The display device of claim 12, wherein a third overlapped configuration of the fifth opening and the seventh opening and a fourth overlapped configuration of the sixth opening and the eighth opening are symmetrical to each other about a line of symmetry disposed between the seventh opening and the eighth opening in a plan view.

14. The display device of claim 13, wherein a first overlapped configuration of the first opening and the third opening is identical to the third overlapped configuration and a second overlapped configuration of the second opening and the fourth opening is identical to the fourth overlapped configuration.

15. A display device comprising:

a lower substrate including a pixel defining layer that includes a plurality of first openings through which a first color of light is configured to emit; and an upper substrate including a first color filter that includes a first surface contacting the upper substrate and a second surface opposite to the first surface in a vertical direction perpendicular to the upper substrate, and a light blocking layer that is disposed on the first color filter and includes a plurality of second openings exposing the plurality of first openings through which the first color of light is configured to emit, respectively, wherein the first color filter is disposed between the upper substrate and the light blocking layer along the vertical direction perpendicular to the upper substrate, wherein shortest distances between adjacent openings of the plurality of second openings adjacent to each other in one direction are not same, wherein the plurality of first openings comprises a first lower opening and a second lower opening, and the plurality of second openings comprises a first upper opening and a second upper opening, wherein the first upper opening exposes a left edge of the first lower opening, and the second upper opening exposes a right edge of the second lower opening, and wherein an entirety of a top surface of the light blocking layer directly contacts the second surface of the first color filter.

16. The display device of claim 15, wherein a center of one of the plurality of the first openings and a center of one of the plurality of the second openings in one pixel is not disposed on a same point even when the plurality of the first openings and the plurality of the second openings are correctly aligned.

17. The display device of claim 16, wherein a first overlapped configuration of the first lower opening in the plurality of first openings and the first upper opening in the plurality of second openings corresponding to a first pixel displaying a first color and a second overlapped configuration of the second lower opening in the plurality of first openings and the second upper opening in the plurality of second openings corresponding to a second pixel displaying the first color and disposed adjacent to the first pixel are symmetrical to each other about a line of symmetry which is disposed between the first pixel and the second pixel in a plan view.

18. The display device of claim 16, wherein a first overlapped configuration of the first lower opening in the plurality of first openings and the first upper opening in the plurality of second openings corresponding to a first pixel displaying a first color and a second overlapped configuration of the second lower opening in the plurality of first openings and the second upper opening in the plurality of second openings corresponding to a second pixel displaying the first color and disposed adjacent to the first pixel are symmetrical to each other about a point of symmetry which is disposed between the first pixel and the second pixel in a plan view.

* * * * *